(12) United States Patent
Kumar et al.

(10) Patent No.: US 9,006,841 B2
(45) Date of Patent: Apr. 14, 2015

(54) DUAL PORT SRAM HAVING REDUCED CELL SIZE AND RECTANGULAR SHAPE

(75) Inventors: Shishir Kumar, Uttar Pradesh (IN); Dibya Dipti, Uttar Pradesh (IN); Pierre Malinge, Beacon, NY (US)

(73) Assignee: STMicroelectronics International N.V., Amsterdam (NL)

( * ) Notice: Subject to any disclaimer, the term of this patent is extended or adjusted under 35 U.S.C. 154(b) by 244 days.

(21) Appl. No.: 13/591,663

(22) Filed: Aug. 22, 2012

(65) Prior Publication Data

US 2013/0170275 A1     Jul. 4, 2013

Related U.S. Application Data

(60) Provisional application No. 61/632,820, filed on Dec. 30, 2011.

(51) Int. Cl.
*H01L 27/11* (2006.01)

(52) U.S. Cl.
CPC ............ *H01L 27/1104* (2013.01); *H01L 27/11* (2013.01); *Y10S 257/903* (2013.01)

(58) Field of Classification Search
CPC ...... H01L 27/11; H01L 27/1104; G11C 5/02; G11C 5/025; G11C 5/06; G11C 5/063; G11C 11/41; G11C 11/412
USPC .......... 257/379, 401, 903, E21.661, E27.098; 365/51, 63, 72
See application file for complete search history.

(56) References Cited

U.S. PATENT DOCUMENTS

| | | | | |
|---|---|---|---|---|
| 7,592,247 | B2 * | 9/2009 | Yang et al. .................... | 438/618 |
| 7,738,282 | B2 * | 6/2010 | Liaw ............................. | 365/154 |
| 8,638,592 | B2 * | 1/2014 | Badrudduza et al. ......... | 365/154 |
| 2006/0215441 | A1 * | 9/2006 | Matsushige et al. .......... | 365/154 |
| 2011/0026289 | A1 | 2/2011 | Liaw | |

* cited by examiner

*Primary Examiner* — Allison P Bernstein
(74) *Attorney, Agent, or Firm* — Seed IP Law Group PLLC

(57) ABSTRACT

A dual port SRAM has two data storage nodes, a true data and complementary data. A first pull down transistor has an active area that forms the drain region of the first transistor and the true data storage node that is physically isolated from all other transistor active areas of the memory cell. A second pull down transistor has an active area that forms the drain region of a second transistor that is the complementary data node that is physically isolated from all other transistor active areas of the memory cell.

9 Claims, 16 Drawing Sheets

DUAL PORT SRAM HAVING REDUCED CELL SIZE AND RECTANGULAR SHAPE

BACKGROUND

1. Technical Field

This invention relates to dual port SRAMs and, in particular, to a dual port SRAM having a reduced feature size in a rectangular-shaped cell layout.

2. Description of the Related Art

A dual port SRAM circuit is shown in FIG. 1 of a type well known in the art. Dual port SRAMs are particularly advantageous in certain types of memories to allow fast access for reading and writing. For example, dual port SRAMs may be used for the internal memory of a microprocessor in various stack registers. A dual port SRAMs is also frequently used in high speed communications, image processing, a FIFO and other circuits in which high speed and high reliability are required while accessing the memory cell through multiple ports during time periods which may overlap and even occur simultaneously. For these reasons, dual port SRAMs of the circuit type as shown in FIG. 1 have particular benefits across a wide range of products.

Embedded SRAMs are particularly popular for use in high speed communication, image processing, and other applications. SRAMs have the benefit they can hold data without the need for refresh. A standard SRAM cell has two pass gates for transistors through which a bit can be read or written at the same time the complement of the bit is read or written in the other storage node. Dual port SRAMs have four pass gate transistors instead of two pass gates, providing more access to the memory cell. With two ports, the bits stored in the SRAM can be read from two ports, A and B, simultaneously. This allows for parallel operation by different applications. Moreover, if a dual port SRAM has a first SRAM cell and a second SRAM cell in the same column or in the same row, a read operation to the first SRAM cell can be performed simultaneously with a write operation on the second SRAM cell, providing significant benefits in access capabilities.

The details of operation of a dual port SRAM are well known to those of skill in the art and therefore the details need not be repeated here. In summary, data is stored at node 1 and the complement of the data stored at node 2, sometimes called true data and false data, or data and $\overline{data}$, written "data bar". The data can be read from node 1 by enabling the wordline at port A and reading the bitline at port A. In addition, the same data can be accessed by enabling the wordline at port B and reading the data at port B. Similarly, the data stored at node 2, which will be the opposite digital value of the data stored at node 1, can be accessed either through bitline $\overline{A}$ or bitline $\overline{B}$ when the respective wordlines of port A and port B are enabled.

FIG. 1 shows a standard eight transistor dual port SRAM cell of a type well known in the art. It includes pull up transistors PU-1 and PU-2 which are realized in P-channel transistors. It also includes pull down transistors PD-1 and PD-2. Pass gates PG-1 and PG-3 form a first port, port A, and are controlled by a single wordline labeled Port A WL. Pass gates PG-2 and PG-4 form a second port, port B, and are controlled by the wordline labeled Port B WL. The stored bit can be read through port A using bitlines port ABL and port $\overline{A}$ BL or through port B using bitlines port BBL and port $\overline{B}$ BL.

There are eight transistors in the particular dual port SRAM of this design, two of which are P-channel transistors labeled PU-1 and PU-2 and the remainder of which are N-channel transistors. Accordingly, the layout of eight transistors to make a single memory cell may sometimes result in the cell taking a relatively large area and also having the necessity for a large number of conductive lines of both polysilicon and metal which must access the memory cell further increasing the size of the memory cell due to the large number of contacts which must have access to the memory cell.

One prior approach in forming a dual port memory cells is described in U.S. Patent Publication No. 2011/0026289 issued to Liaw ('289 Liaw). FIG. 2, as shown herein, is a copy of FIG. 6 of '289 Liaw, which he admitted as prior art to his work. In this layout of the dual port SRAM, the pass gates of port A, PG-1 and PG-3, are one side of the memory cell, in FIG. 2 the right side, while the pass gates for port B, PG-2 and PG-4, are on the opposite, left, side of the memory cell. (Because FIG. 2 is a photocopy from the prior art publication '289 Liaw, it contains many reference numbers and markings from the '289 Liaw application which need not be repeated and described herein. If a tracking of the reference numbers to the Figure as used in FIG. 2 is desired, the reader is directed toward the '289 Liaw publication, which is incorporated herein by reference. In order to maintain clarity, reference numbers used in FIG. 2 of the '289 Liaw publication will not be repeated when describing in the present invention.)

The wordline contacts are spaced far from each other, on opposite sides of the memory cell as well. In addition, the smallest transistors of the memory cell, PU-1 and PU-2, are placed in the center of the memory cell and the active regions thereof are placed in series with the active regions of PD-1 and PD-2 to form nodes 1 and 2, respectively. The result is that the cell is relatively long and narrow with an aspect ratio of greater than 5. Namely, its length is approximately five times greater than that of its width.

FIG. 3 illustrates performance problems which can occur with a prior art layout of the type shown in FIG. 2. FIG. 3 is a copy of FIG. 5A of the '289 Liaw publication. In a memory cell layout of this type, the performance is degraded due to a high wordline capacitance which results in a high wordline RC time constant. One of the causes of this is the large aspect ratio, greater than 5 of the bit cell. If there are many columns, in excess of 300 columns, the performance degrades by greater than 5% based on the aspect ratio alone. Other features of the layout of the memory cell create additional problems.

Some of these problems with this prior art are described in '289 Liaw and therefore not all the figures and the detailed text are repeated herein. In summary, a few of the problems include that, in order to support parallel operation in which two pass gates might be on concurrently or, potentially simultaneously, the transistors PD-1 and PD-2 need to sustain twice the drive current of a pass gate transistor PG. Therefore, the pull down transistors PD-1 must have nearly twice the width and size of the PG transistors. Typically, either an L-shaped region or, as shown in FIG. 2, a T-shaped active region is used to provide the uneven device sizing that is required due to this type of layout in which the pass gates and storage nodes are formed in common in silicon.

While in FIG. 2, the T-shaped active areas located at node 1 and node 2 are shown as having 90° angles at the location where the two lines meet and having sharp corners, in fact, due to optical effects during photolithographic processing, all sharp edges become significantly rounded because the memory cell is being produced at the optical limits of the available wavelength using during the photolithographic process. The result will be rounded edges and that the available width of the transistor is reduce resulting in degraded cell performance. In addition, if a misalignment occurs, the gate electrode of the PG transistors may not be in the expected location unless the width is increased. This will result in a greater mismatch between the pass gates and the other transistors, thus significantly degrading SRAM cell performance. In addition, there will be problems in current grabbing at the intersection junction. Therefore, some portions of PD-1 and PD-2 will have greater current densities than other portions and significant problems further degrading performance and impacting the reliability. In addition, junction linkage is also a problem in a cell layout of this type.

FIG. 4, as shown, illustrates one of the problems of degraded performance of the memory cell when performing a read. FIG. 4 is a copy of the main portions of the transistors from FIG. 2, however, for ease in understanding the illustration of the current flow, only a few of the conductive layers are shown and only some of the main components of the memory cell are labeled in FIG. 4, thus providing a more simplified view of the memory cell from that shown in FIG. 2.

FIG. 4 illustrates one of the problems of the many shortcomings of a memory cell laid out as shown in the prior art of FIG. 2. The read current path for port B is marked by the path shown starting at location 20 at the B-bitline contact and ending at location 22. Data is retrieved from node 1 via electrical connections to the bitline contact at the far left-hand side of the cell. At the same time, the bitline bar data path, namely the complementary data, is obtained from node 2 via the current path shown having a starting location at 24 and ending at 26 passing through node 2. The complementary data, $\overline{B}$, is obtained from data path 24 to 26. The particular layout arrangement of FIG. 4 has a redegradation of approximately 14% owing to just the following physical effects. There is extra resistance in the true current path 20 to 22 because the electrical conductor must pass through two contacts marked 28 and 30, which are in series, in addition to having to pass through a long conductor in between 28 and 30 due to the extra resistance of polysilicon passing over a shallow trench isolation for a long distance over the length of more than half of the cell. The extended current path, and having to pass through repeated contacts, contributes to a greater than 10% recurrent loss in device sizes of 28 nm with increasing losses at smaller sizes. In addition, the isolated active regions of pass gates are also impacted by STI stress losses which are greater than 4% of the recurrent at the 28 nm device size. This is just one of the many shortcomings of the memory cell of the prior art.

Note that in FIG. 4, not all of the components are shown and some of the layers are not illustrated for ease in understanding the circuit layout and its operation. More of the layers are shown in FIG. 2, which can be studied together with FIG. 4 to see more of the electrical components present. For a more complete understanding, turn to the prior art publication from which the circuit is taken.

FIG. 5 illustrates the solution that Liaw proposes in his '289 Liaw publication as he shows in his FIG. 7. (FIG. 5 herein is a copy of FIG. 7 in the '289 Liaw, including the reference numbers. The operation of his circuit will not be described herein and thus the reference numbers will not be used; the reader is directed to '289 Liaw to obtain a more full description of the reference numbers and the circuit operation.) The previous FIGS. 1-4 are taken from the '289 Liaw publication as his admitted prior art. His goal is to improve on this design. To make this improvement, he proposes a new design as illustrated in FIG. 5 herein and described in more detail in the '289 Liaw publication with respect to his FIGS. 3 and 7. The solution proposed by Liaw is to add two additional transistors which he labels PD-12 and PD-22. One of his goals in adding two additional transistors is to increase the current flow that can be drawn through the pull down transistors to Vss in his attempt to overcome the current flow problems of the prior art. The addition of two transistors makes his memory cells even larger and more difficult to construct in small geometries.

The design of '289 Liaw is difficult to construct in very small device sizes, such as 28 nm and 20 nm. In addition, the 20 nm technology design rules prohibit two wordline connections at two polypitch heights, therefore his solution is unworkable for small memory cells. Further, additional routing resources are required as compared to the single port bit cells for technologies which prohibit a bidirectional polyline as he uses in his gates, such as the ISDA 20 nm technology design rules. A further problem is the use of metal 1 as the local interconnection to connect two fingers of the pull down transistors. This additional routing requirement makes the cell incompatible with many other memory cells and other transistors to be made on the same device which may not permit use of metal 1 for local interconnects. A yet additional problem is the high aspect ratio of the memory cell. The aspect ratio is well over 5 and approaches 6. This causes a high wordline resistance and increased RC values owing to the skewed shape of the bit cell.

BRIEF SUMMARY

A dual port SRAM has two data storage nodes, a true data node and complementary data node. The true data node includes the drain of a first pull down transistor and this drain is located in an active area that that is physically isolated from all other transistor active areas of the memory cell. In addition, it is the active area for just a single transistor and not for multiple transistors. The complementary data node includes the drain of a second pull down transistor and this drain is located in an active area that that is physically isolated from all other transistor active areas of the memory cell. The various active areas are isolated from each other by shallow trench isolation, Sti, located in the substrate. The true data node also includes the drain of a pull up transistor and the combined source/drain of two pass gate transistors. These three active areas are physically separate from each other and are electrically coupled to each other by a single metal strip. The complementary data node has a similar physical and electrical connection.

The common source/drain region of the true data node for two different transistors can be accessed by two different word lines, word line A and word line B, thus providing the two ports for the dual port SRAM. The word lines are electrically coupled to the respective gates of the two different transistors that provide access to the common source/drain region of the true data node when each respective transistor is enabled. The two true bit lines, A and B, couple to the other active areas of the two respective transistors to permit reading of the true data on bit line A or bit line B. A similar arrangement is provided for the complementary bit lines, $\overline{A}$ and the $\overline{B}$ to provide coupling the complementary node.

This particular arrangement has a number of advantageous. First, the active areas of the storage nodes can each be designed to better perform its respective function for the transistor of which is a drain. Since each of the active areas for the storage transistors are physically isolated from each other and is the active area for just a single transistor and is not part of the pass gates, the shape, size and to some extent, the location of each, can be selected to permit the transistor of which it is a part to best perform its function in the memory cell, whether that of a pull-up transistor, a pass gate or a pull-down transistor. Each of these transistors has a specific and width to length ratio that will provide better performance for a given size. The size each active area can therefore be selected to provide a very small memory cell and the shape and location selected for high performance without having to be concerned about the trade off of the performance of another transistor that may share the same active area. Similarly, the active area for the pass gates is physically separate from the active area of both the pull-up an pull-down transistors so that its size and shape can be selected to better perform the function of a pass gate without having to be concerned with the performance tradeoffs of having to design the active area to also function as part of the storage node transistors.

In one embodiment, metal 1, called M1, is a blanket layer deposited over exposed conductive layers without the use of contacts or vias. The layer, after being blanket deposited, if patterned and etched to remove it from all locations in which an electrical connection to M1 is not desired. This use of M1 provides full electrical connection of all internal routing of the memory cell without the use of contacts or vias, thus substantially reducing the size of the cell and increasing the performance in both speed and current carrying ability. In a preferred embodiment, M1 is deposited, patterned and etch in two different layers, each having the same material, but each creating patterns of perpendicular to each other.

The source power supply line, Vss is positioned in the center of the cell and coupled at two locations inside of each cell, to the sources of the pull down transistors. The sources of the two pull-down transistors are separate from each other and not in the same active area. The source power supply line is located at a position relative to the other power supply line, Vdd and to the bit lines that is can be made quite wide to provide lower resistance and faster speeds. The current carrying capability of Vss is high as compared to the bit lines to permit two different bit lines to access the data storage nodes, either concurrently or simultaneously, and still retain the correct data as valid. In addition, in one embodiment, the current carrying capability of Vdd is also high as compared to the bit lines to permit two different bit lines to access the data storage nodes, either concurrently or simultaneously without loss of data.

In one embodiment, the power supply lines Vss and Vdd are formed in different metal levels than either the bit lines or the word lines. This permits the power supply lines to made wider than would be permitted if they were in the same metal layers as either bit lines or the word lines. In one embodiment, the power supply lines are sufficiently wide and the cell is sufficiently compact that the bit lines overlay at least one portion of the supply lines and are electrically isolated from them by a low-K dielectric layer or layers.

The particular layout and sizing of the memory cell permits the memory cell for the dual port SRAM to have an aspect ratio of approximately 3. In some embodiments, the aspect ratio is 3.2 while in others, it is 2.85, both of which are approximately 3. In one embodiment, the aspect ratio is less than 2.5. Having a low aspect ratio, of about 3 or less improves the speed of memory cell for reading and writing while significantly reducing the RC delay in the various conductive lines.

DETAILED DESCRIPTION

Figure 12:
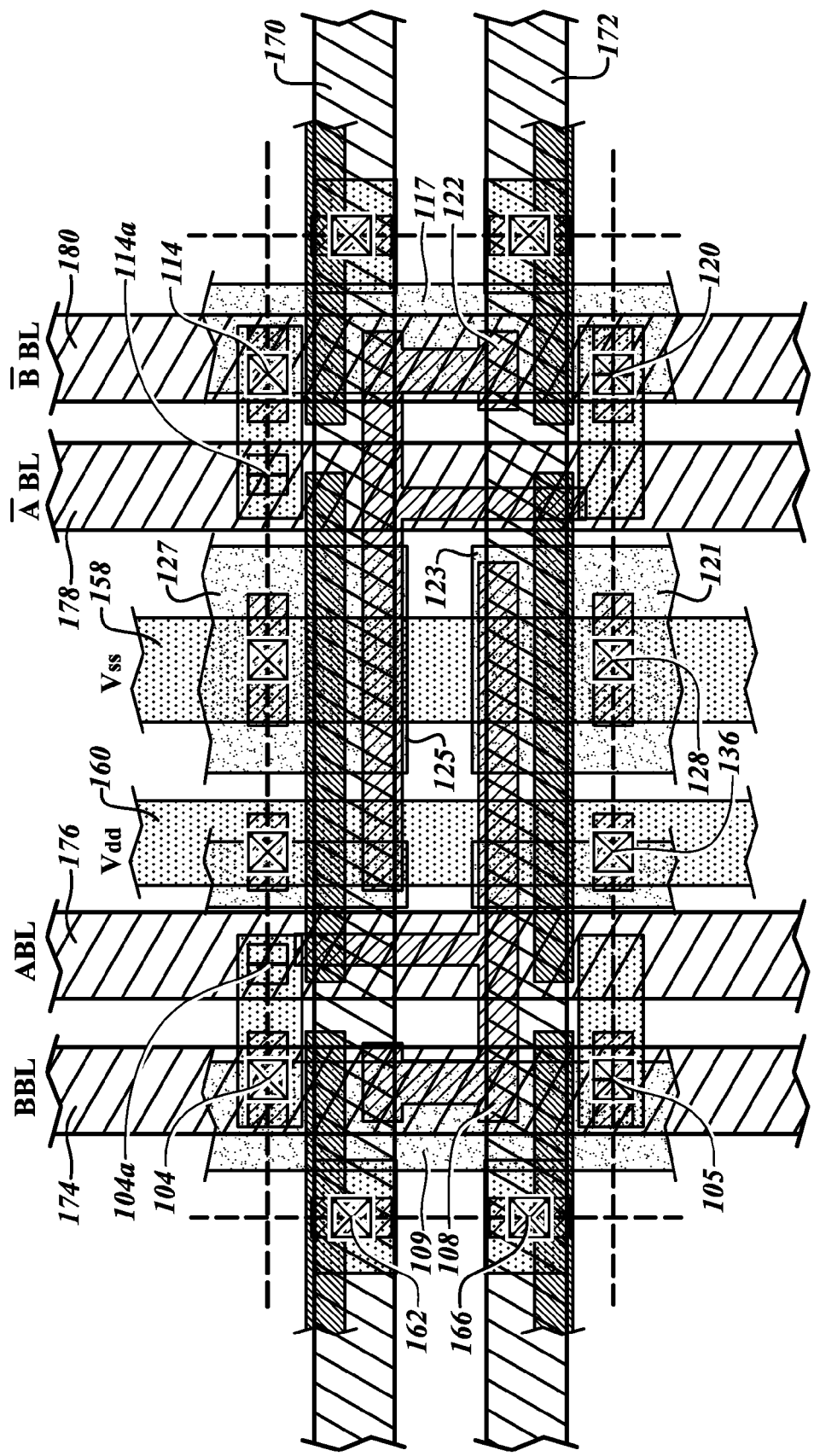
FIG. 12 is a top side view of the memory cell of FIGS. 6-11 showing all of the layers.
Figure 13:
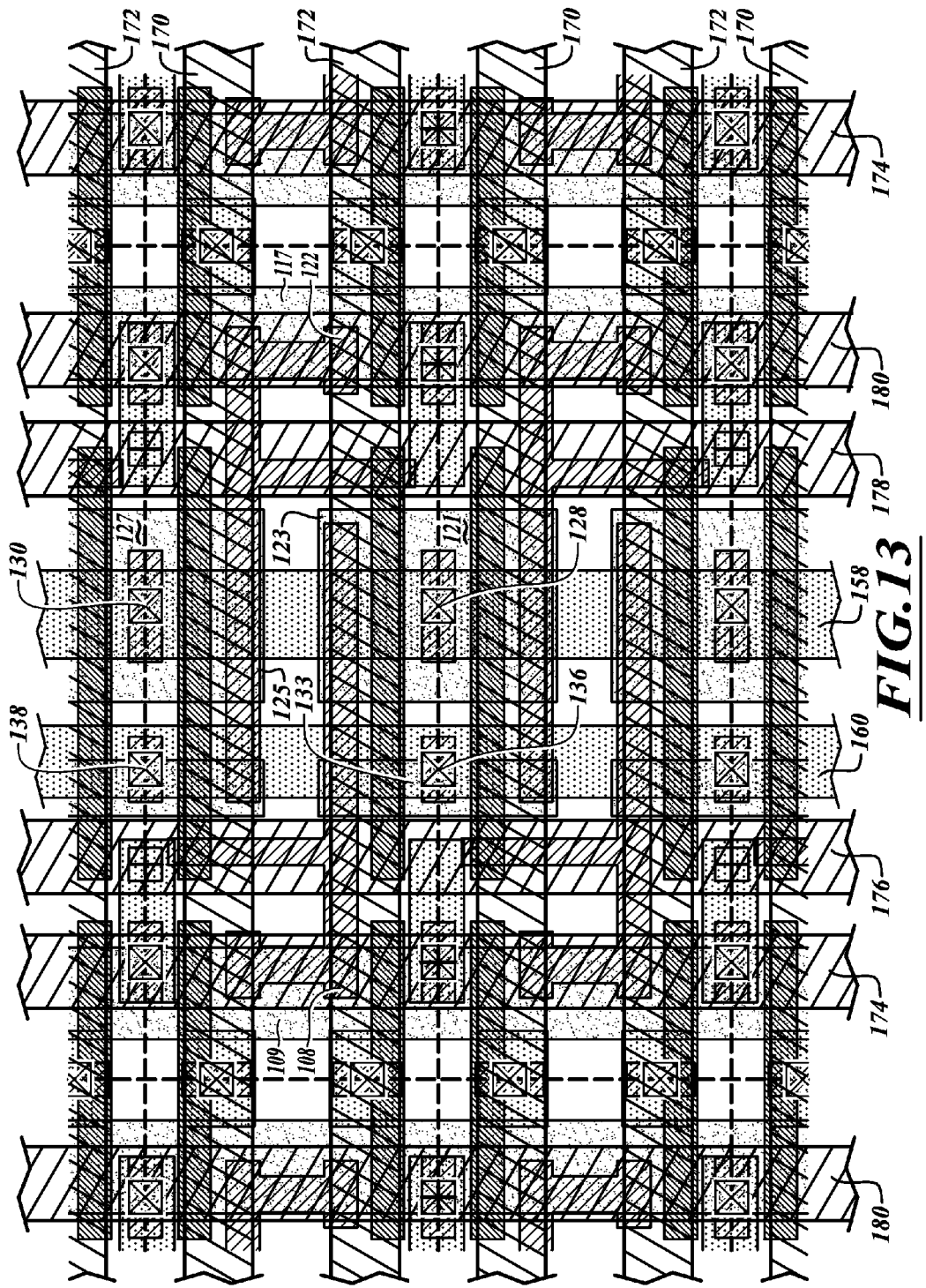
FIG. 13 is a top side view of a layout showing two full memory cells and partial memory cells to the left and right and above and below the two full memory cells, to permit a full understanding of the layout of the entire array.
Figure 14:
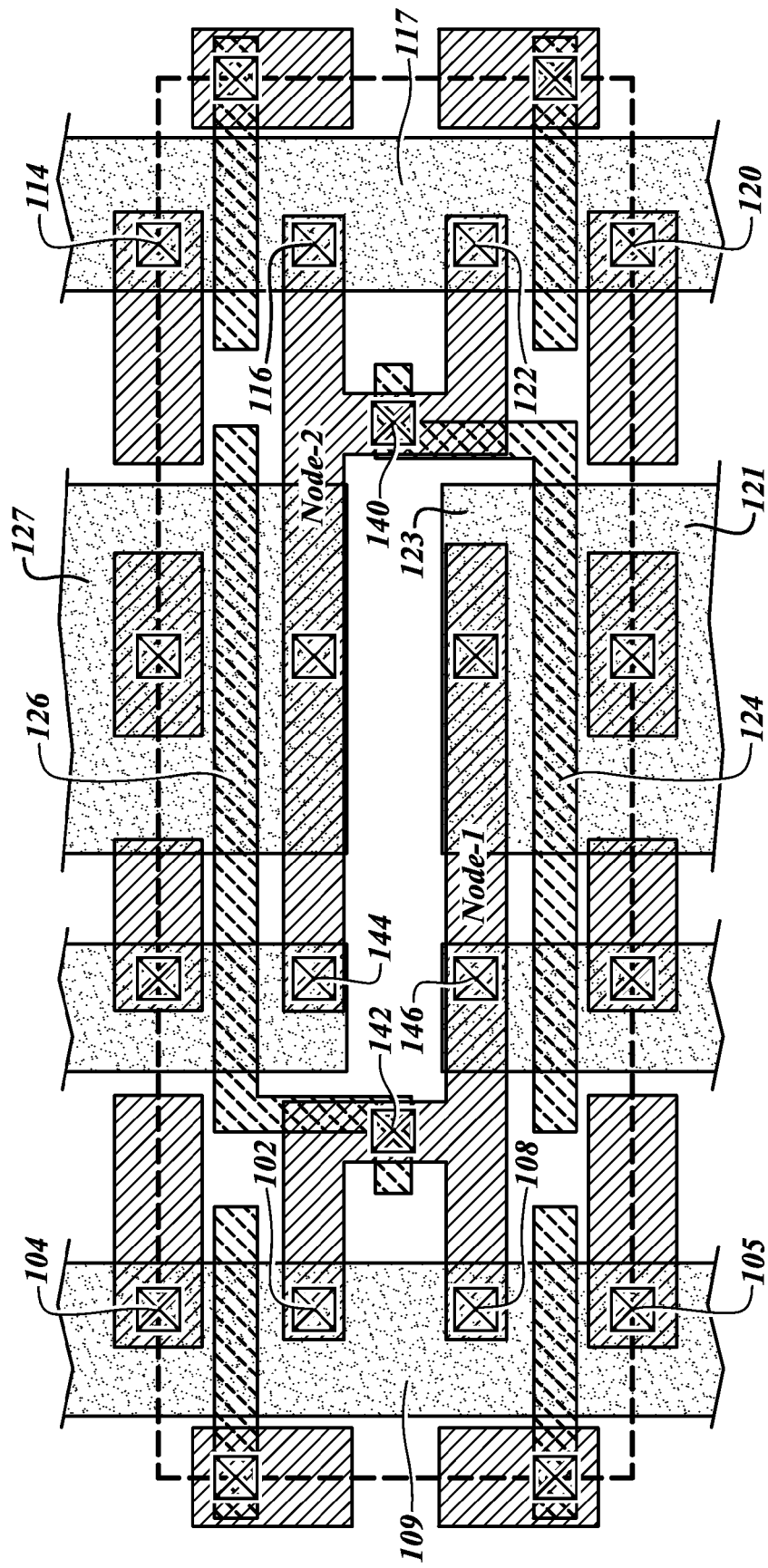
FIG. 14 is a top side view of the layout of an alternative embodiment of the memory cell, showing active area, the gate electrodes, and the first metal layer.
Figure 15:
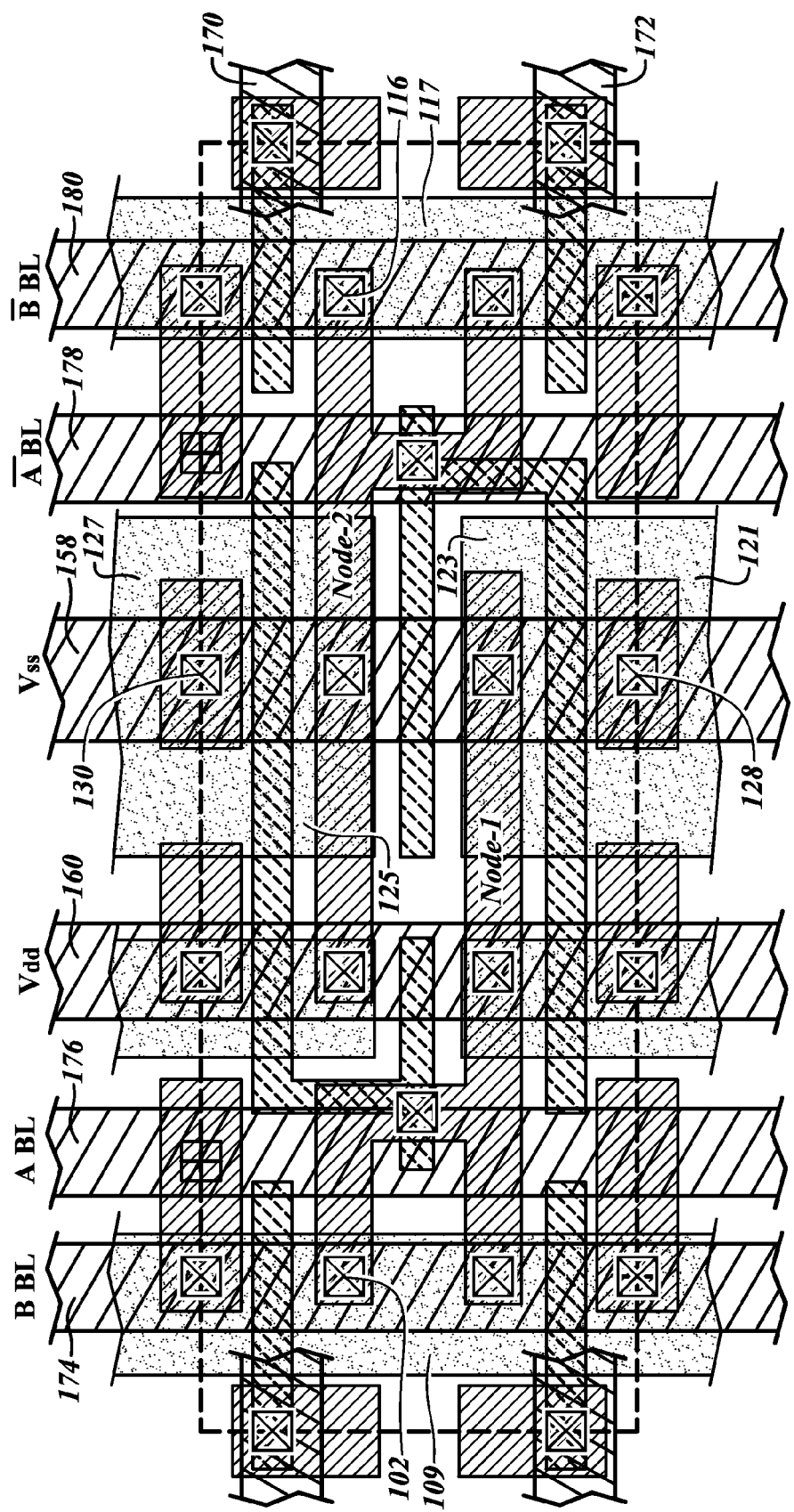
FIG. 15 is a top view of the layout of FIG. 14 with the addition of metal layers 2 and 3.

A new layout is provided for a dual port memory cell as illustrated in FIGS. 6-13, an alternative embodiment of which is shown in FIGS. 14 and 15.

The figures as shown herein are generally to scale with respect to the specific layouts. Namely, the features as shown in the layouts of FIGS. 7-15 are examples that represent the actual relative dimensions of the structures in one embodiment and show the feature sizes relative to each other. Some variation may exist between the different features as shown in these embodiments and their sizes relative to each other, and still fall within use of the present invention since the scope of the invention is defined by the claims and not by the figures or the specification. Namely, the location and general shape of the structures as shown herein constitutes a novel layout with advantageous and unexpected properties. A layout of the type shown herein may have many different sizes of components in different sizes relative to each other and still fall within the scope of the present invention. Thus, one feature is the relative location of the various components to each other irrespective of their sizes. In other embodiments, the size is also beneficial and considered relevant. Accordingly, both the relative location of the structures to each other as shown in one embodiment, as well as a view of the size of the structures relative to each other, can be considered relevant, though each may be used independent of the other in making use of the present invention. Notably, if the same structural components as shown herein are in the same location but various conductive lines are made substantially larger, the aspects of the invention are still practiced and the improvements as described herein will still be obtained.

Figure 1:
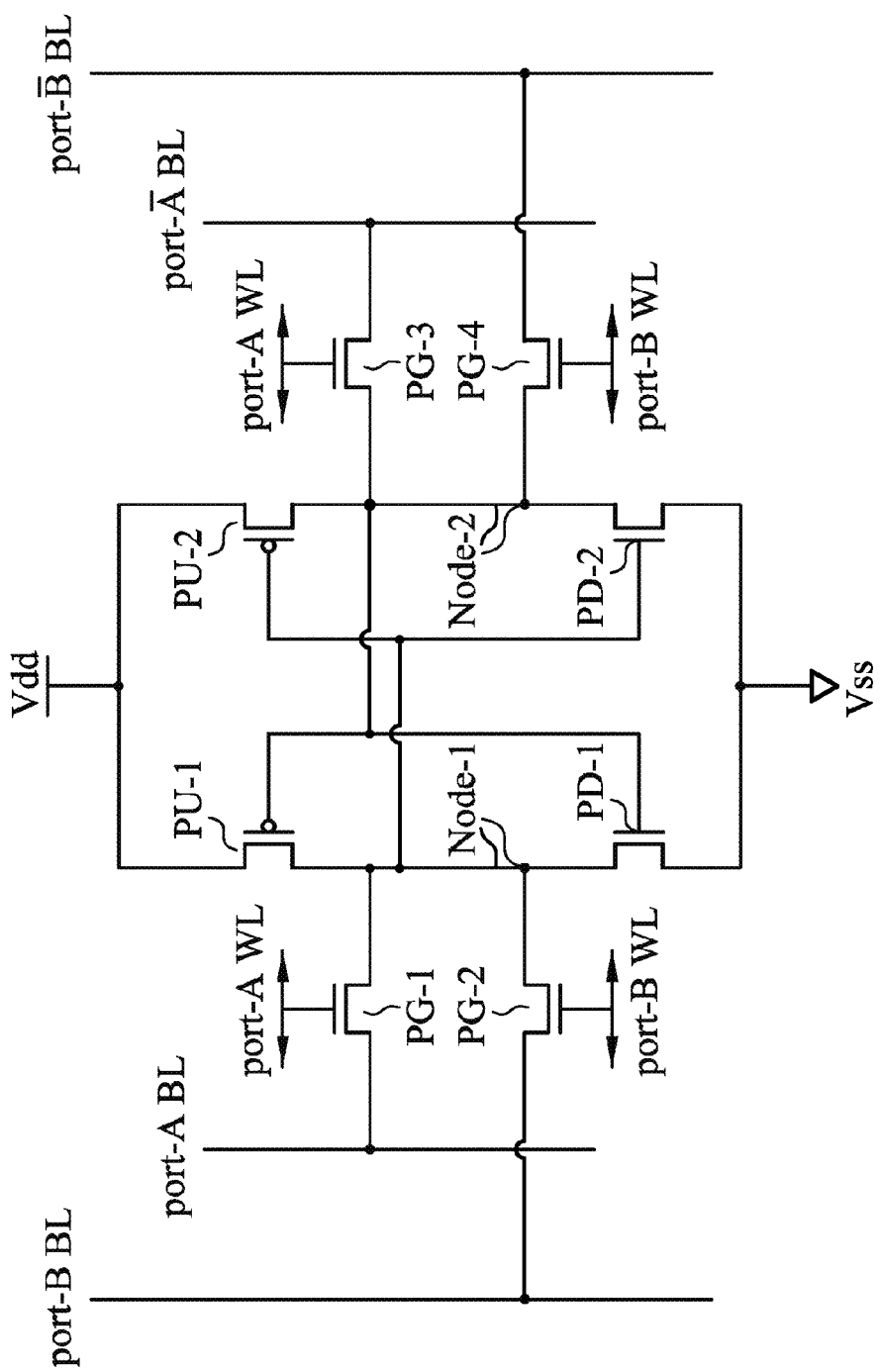
FIG. 1 is an electrical schematic of the dual port SRAM taken from a prior art publication, U.S. 2011/0026289, to Liaw.
Figure 2:
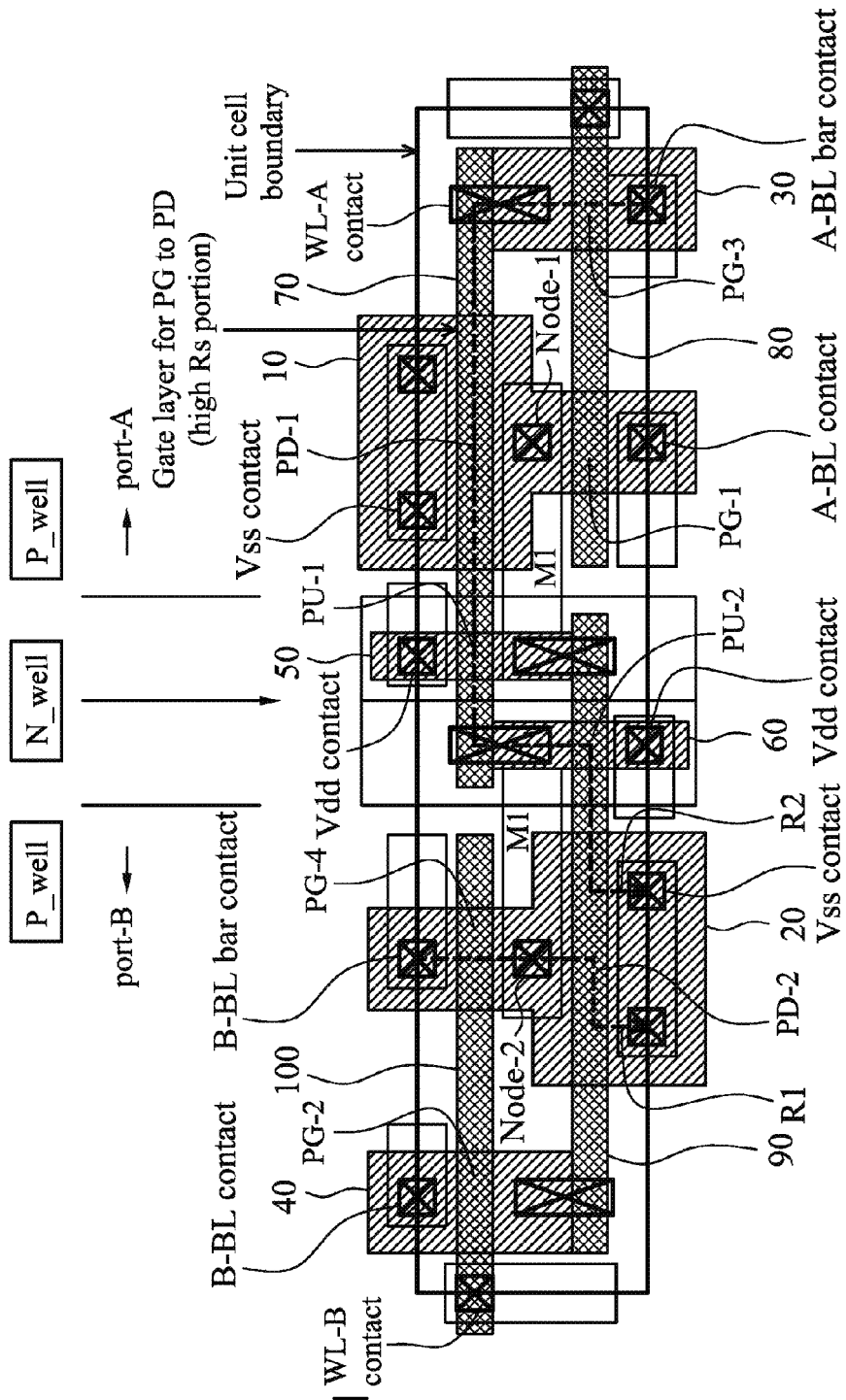
FIG. 2 is a copy of FIG. 6 from the same prior art, '289 Liaw.
Figure 3:
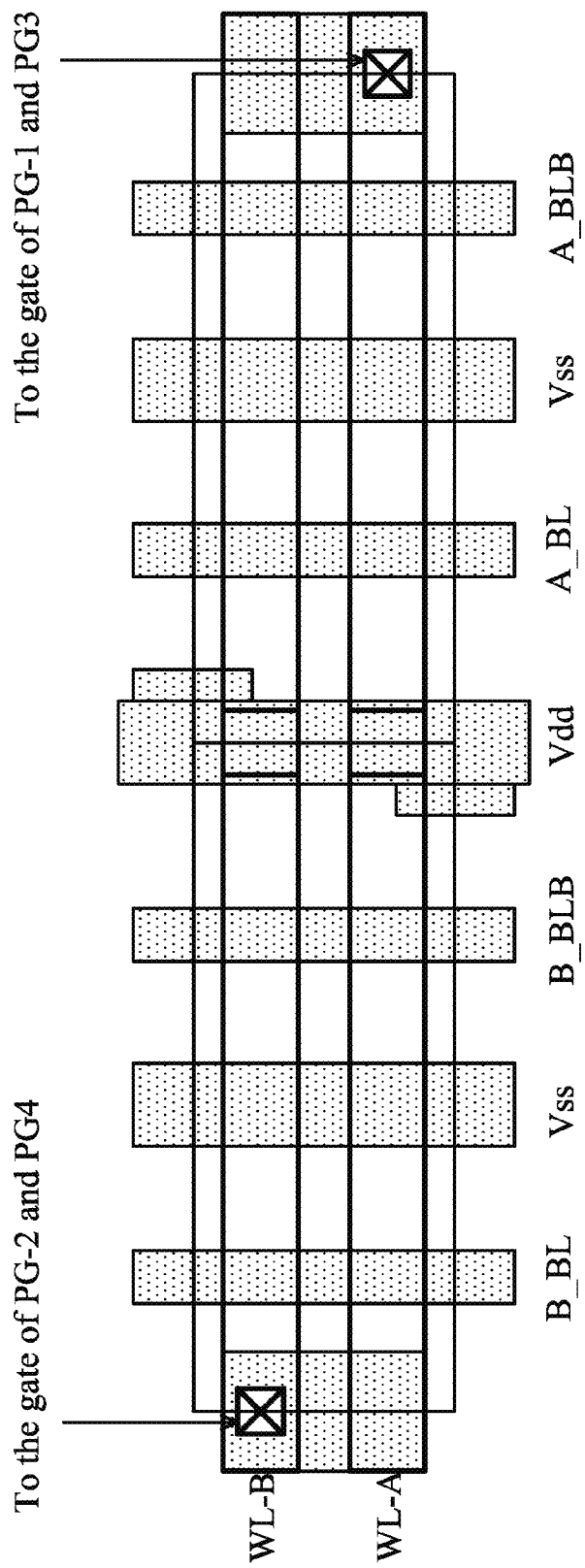
FIG. 3 is a copy from FIG. 5A of the same '289 Liaw.
Figure 4:
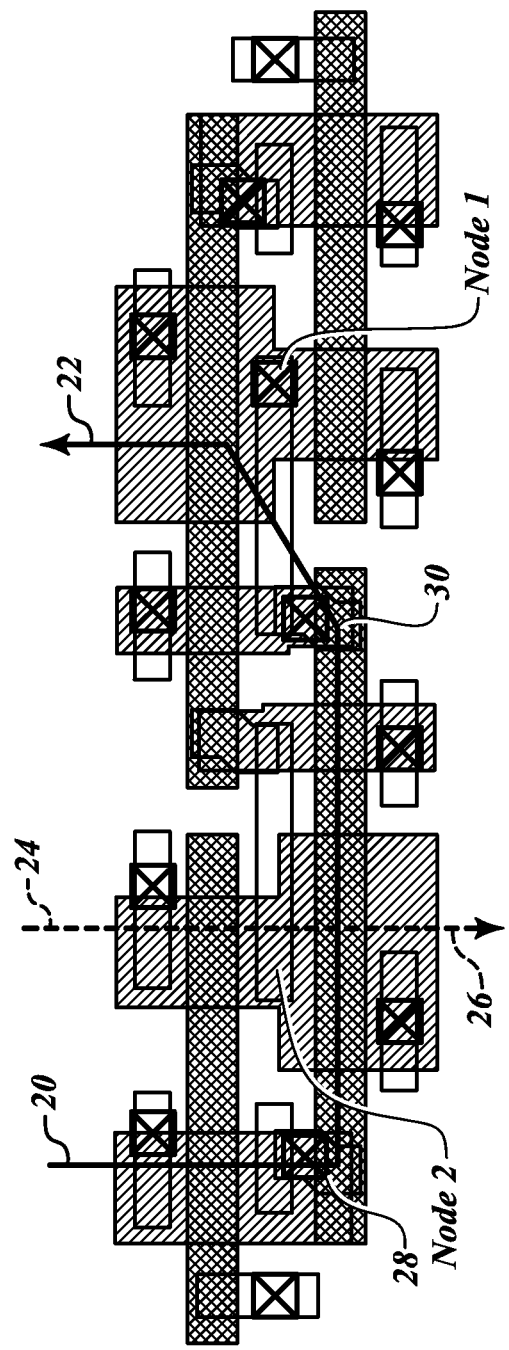
FIG. 4 is a simplified diagram of the operation of FIG. 2 disclosed herein.
Figure 5:
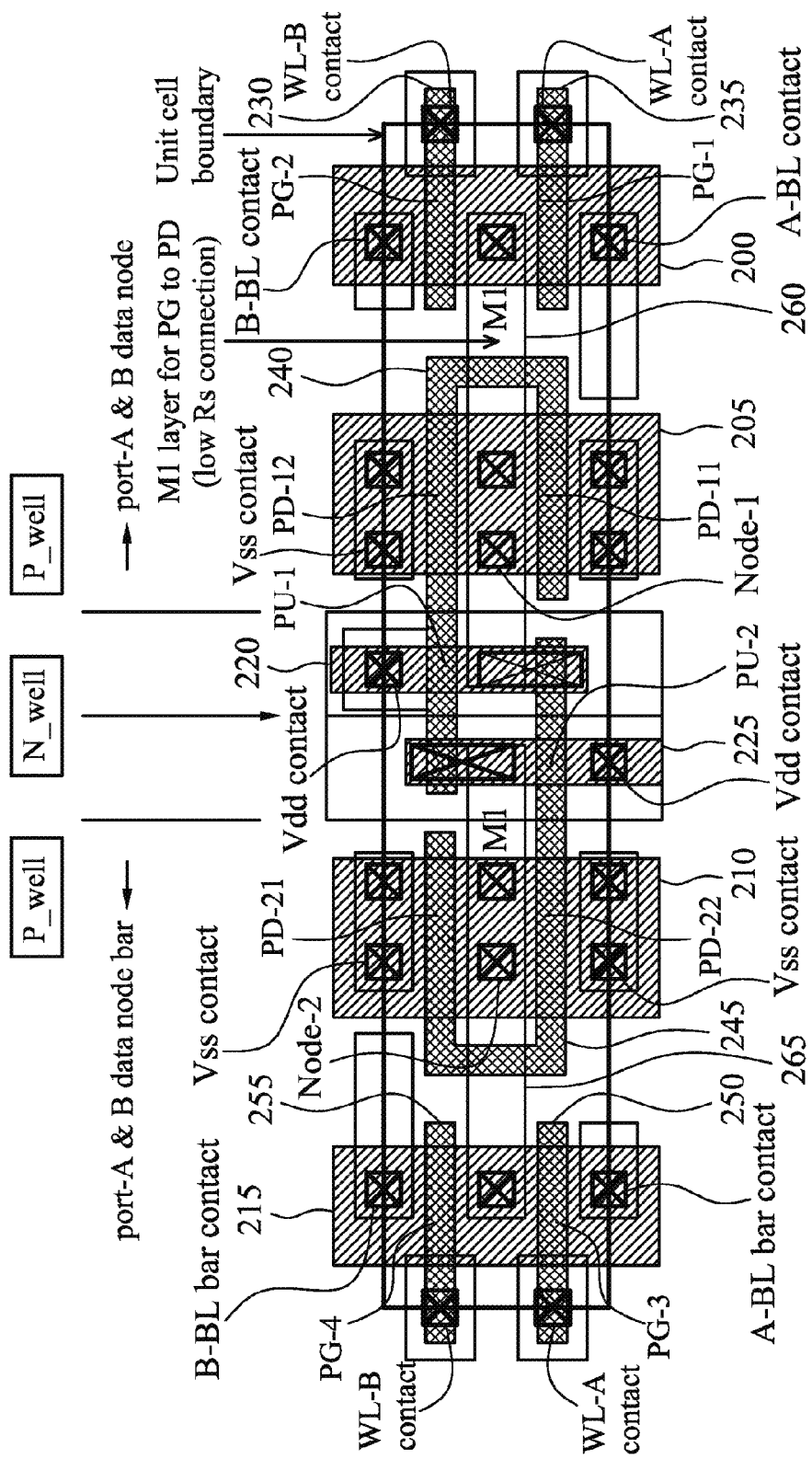
FIG. 5 is a copy from FIG. 7 of the '289 Liaw.
Figure 6:
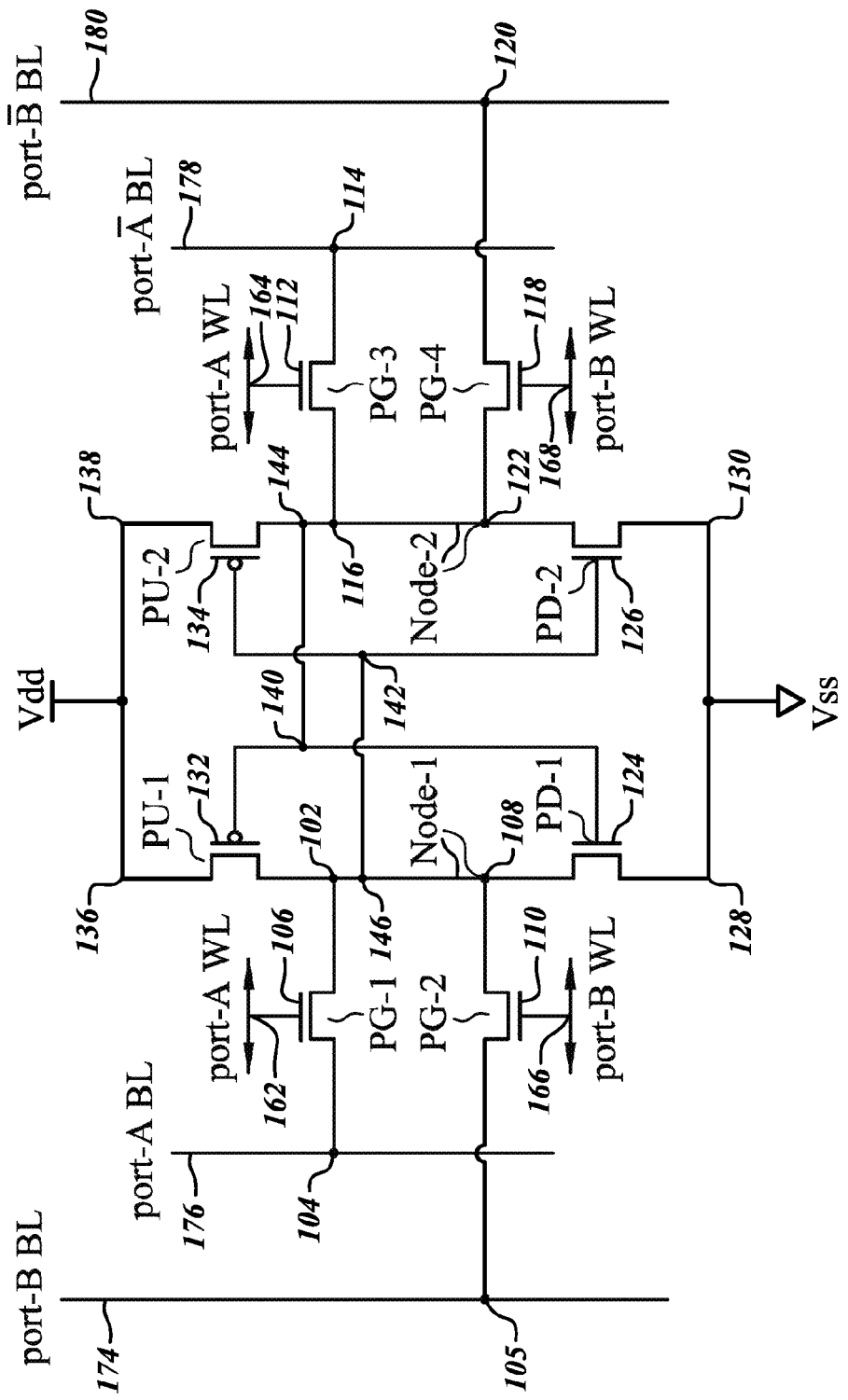
FIG. 6 is a circuit diagram of a dual port SRAM labeled and explained with respect to the present invention.

FIG. 6 shows the electrical connections for the transistors in a dual port SRAM having a cell layout according to the present invention. While the electrical connections for a dual port SRAM are well known and established in the art, individual nodes are labeled in the electrical circuit of FIG. 6 for ease of explanation to show correspondence to their location in the physical layout in FIGS. 7-13. The reference numbers as used in FIG. 6 should therefore be consulted in when viewing the other figures to see the physical location of the electrical nodes labeled in FIG. 6 since common reference numbers are used in all figures.

Viewing FIG. 6, data true is stored at node 1 and the complementary data, also sometimes called data false, is stored at node 2. The bitline of port A makes a connection at the location labeled 104 through the pass gate PG-1 which connects to node 1 at point 102. When the gate electrode 106 of the A wordline goes high, data is allowed to pass between nodes 102 and 104 in either direction. Similarly, the B bitline has a connection node 105 to one side of pass gate transistor PG-2 and couples at node 108 to node 1. When the gate electrode 110 of the transistor PG-2 goes high, data can pass between nodes 105 and 108. Access is provided in a similar manner to corresponding node 2 in which taking the gate electrode 112 of transistor PG-3 high couples node 114 of bitline to node 116 that is part of node 2. Taking gate electrode 118 high, which is part of port B wordline, couples node 120 of B bitline to node 122 which is part of node 2. The pull down gates PD-1 and PD-2 have gate electrodes labeled respectively 124 and 126. The sources of the respective pass gates are coupled to ground Vss at nodes 128 and 130. The pull up transistors PU-1 and PU-2 have gate electrodes 132 and 134. Their sources are connected to Vdd through respective contacts at 136 and 138. The cross-coupling of the transistors to form the SRAM cell occurs with contacts made at nodes 140 and 142. Node 140 which couples to the gate electrodes of PU-1 and PD-1 couples to node 2 at location 144. Node 142 coupled to the gates of transistors PU-2 and PD-2 and to node 1 at location 146. Port A wordline is coupled to the gate electrodes at pass gates at nodes 162 and 164, and Port B wordline is coupled to the gate electrodes of the pass gates at nodes 166 and 168. Using FIG. 6 as a reference, the following figures and the layout of the memory cell will now be described.

Figure 7:
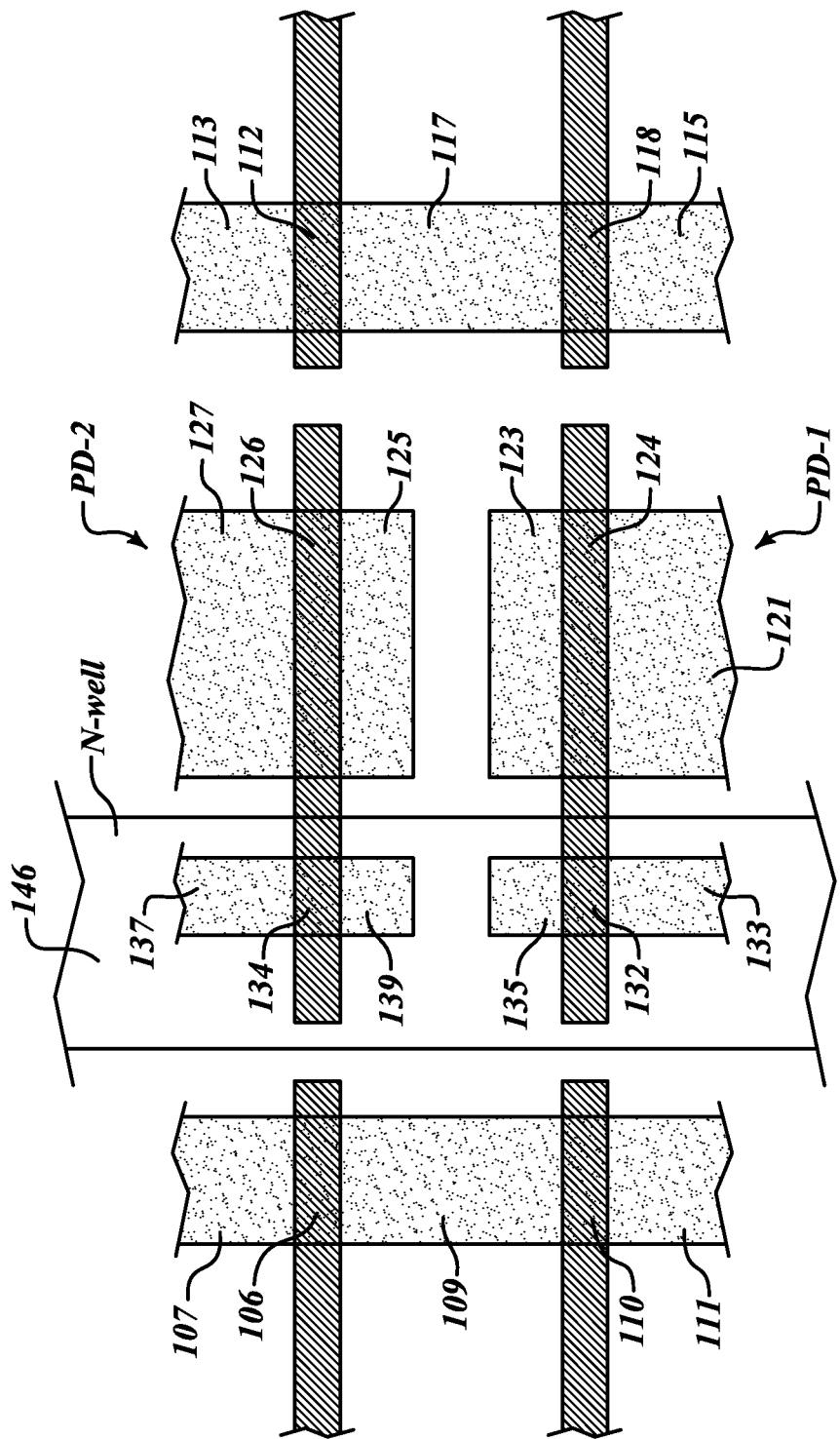
FIG. 7 is a top side view of the layout of the memory cell of FIG. 6 showing the active area and gate electrodes.

FIG. 7 shows the active areas and gate electrodes of the layout of the memory cell of FIG. 6 according to the inventive arrangement. For ease of understanding, different layers will be shown in different figures with progressively more layers in each figure. Because memory cells have numerous conductive layers which overlap on top of each other, in some cases making electrical contact while in other case being electrically insulated from each other, a showing of the various layers together with a description of where electrical contact is made is beneficial for an understanding of the memory cell layout and its operation.

FIG. 7 shows active areas for the P-channel and N-channel transistors as will now be explained. An N-well 146 contains P-channel transistors PU-1 and PU-2. A gate electrode 132 with a source region 133 and a drain region 135 on either side thereof make up transistor PU-1. Similarly, transistor PU-2 has a gate electrode 134 with a source region 137 and a drain region 139 on either side thereof. The active areas are isolated from each other by shallow trench isolation, Sti, or some other electrical isolation of a type well known in the art.

As also shown in FIG. 7, the pass gates of transistor PG-1 has a gate electrode 106 with a first source/drain region 107 on one side and a joint source/drain region 109 on the other. (Since the region 107 may act as either the source or the drain, it is referred to as a source/drain region; the same is true for region 109. Transistor PG-2 has a gate electrode 110 also with a first source/drain region 111 on one side and a joint source/drain region 109 on the other. The transistors PG-1 and PG-2 are electrically and physically in common at active area 109 as will also be shown in the later figures as more electrical connections are added. Similarly, transistors PG-3 and PG-4 have respective gate electrodes 112 and 118 which electrically and physically couple their common source/drain region 117. Each of which also have their respective source/drain regions 113 and 115 to which the bitline bar circuits will be connected as explained later herein. The pull down transistors of the memory cell, PD-1 and PD-2, have respective gate electrodes 124 and 126. These gate electrodes connect to Vss at their sources 121 and 127 as will be explained later herein. Their respective drains 123 and 125 are part of the storage nodes of node 1 and node 2, respectively.

Viewing the active areas and the gate electrodes of FIG. 7, a number of salient features of the inventive memory cell can be noted. All of the gate electrodes run straight, exactly in line with each other. Namely, the gate electrodes for transistors 110, 132, 124, 118 all are in the same line with each other and can be made as a constant single metal strip but, having two locations at which the line is cut in order to electrically isolate gates 110 and 118 from each other and from the common gates 132 and 124. The gates which are in common, 124 and 132, are a single straight line which extends across the active area that makes up transistors PD-1 and PU-1, respectively. The memory cell contains a second gate electrode strip which runs parallel to and also in a straight line to provide the gates of the four other transistors of the memory cell. Namely, a single electrical strip is provided which forms the gates 106, 112, 126, 134. The strip is cut at two locations inside the memory cell to electrically isolate gates 106 and 112 from each other and also the common transistor gates 126 and 134 from the gates for the pass transistors for the port A, PG-1 and PG-3, which are provided by gate electrodes 106 and 112. The parallel gate electrodes are also aligned at each end, going from left to right, although this is not required in all embodiments.

The use of two single straight electrical conductors to provide the gate electrodes for all eight transistors in the memory cell has significant advantages. A first advantage is that the memory cell is scalable to very small design rules. This particular memory cell can be implemented easily in 32 nm technology and because of its straight lines and parallel arrangement of the gate electrodes with respect to each other, can be easily shrunk and adapted to 28 nm, 20 nm, and it is expected to be scalable down as low as photolithographic dimensions permit, perhaps in the 10 nm range and smaller. While this particular arrangement is particularly advantageous for a dual port SRAM having eight transistors therein, there may be some implementations in which it is useful for the standard SRAM cell, the 6T cell, having only six transistors.

A single contiguous conductive strip provides the common gate for both the N-channel and P-channel transistors within the memory cell, namely gate electrodes 124 and 132. No additional contacts, vias, or other vertical electrical connections are required to tie these gates to each other. The gate runs in a straight line, without bends, curves, or corners. A similar arrangement is provided for the gates of the other two transistors in the memory cell as well as for the transistors which form the pass gates. This provides the benefits that the gate length can be shrunk or expanded as much as necessary for the desired design rule. (Note that the gate length in this technology art is the distance between the source and the drain of a transistor under the gate electrode and in the drawing of FIG. 7 would be seen as being the width of the gate electrode.) Therefore, scaling of the gate electrode to be as small as possible can be easily obtained according to this design.

The true data node includes the drain of a first pull down transistor and this drain is located in an active area that that is physically isolated from all other transistor active areas of the memory cell. In addition, it is the active area for just a single transistor and not for multiple transistors. The complementary data node includes the drain of a second pull down transistor and this drain is located in an active area that that is physically isolated from all other transistor active areas of the memory cell. The various active areas are isolated from each other by shallow trench isolation, Sti, located in the substrate. The true data node also includes the drain of a pull up transistor and the combined source/drain of two pass gate transistors. These three active areas are physically separate from each other and are electrically coupled to each other by a single metal strip. The complementary data node has a similar physical and electrical connection.

This design also provides the common source/drain regions of the pass gates in a compact arrangement. The transistors of the memory cell which benefit from a very wide channel region, the pull down transistors PD-1 and PD-2, can be seen in very center of the memory cell. As can be seen, the transistors that are PD-1 and PD-2 will be the largest transistors in the entire memory cell. They have a very large width-to-length ratio and can easily carry a large amount of current with low resistance. (In this art the width of the transistor is measured going from left to right over the active area in the figures as shown for each active area.) The active area of these transistors is made as a simple geometric shape of a rectangle which can be easily formed even at very small geometries, 20 nm and smaller. Similarly, the active areas and silicon of the pull up transistors, PU-1 and PU-2, are also formed as rectangles having straight and parallel lines on two of the sides and straight parallel lines on the other two sides. The use of simple rectangles for all of the active areas of the transistors provides a very compact memory cell which can be easily formed on very tight design rules, 20 nm and smaller. As shown in FIG. 7, the respective drain areas for the pull down transistors are used only for the two pull down transistors, respectively. Many memory cell layouts attempt to save area by combining the drain area that is the data node 1 with active area of the pass gate to form a contiguous substrate active area. The present embodiment uses area 123 as the drain of PD1 and area 125 as the drain of PD2 physically isolated from other active areas. Instead, area savings is gained by active areas 109, 117 of the respective pass gates in common.

As photolithographic dimensions shrink, a memory cell of this type of layout can easily be adapted without additional structural changes to the layout in silicon. Therefore, the memory cell can be easily formed in existing technology of 40 nm, shrunk to 32 nm, and then continually shrunk down to smaller geometries without the need for further redesign and easy adaptation. Similar arrangements are provided for the active area of the wordline transistors, namely the sides are parallel to each other and extend for a long distance without bends or curves. As can be seen, each of the transistors in the memory cell have an active area in silicon in the form of rectangles in which the two sides facing each other are parallel for their extended entire length. This can also be seen in FIG. 13 later herein.

In a preferred embodiment of the design of FIG. 7, the gate electrodes are composed of a metal layer. While many transistors have polysilicon gate electrodes at sizes of 65 nm and larger, as devices sizes shrink to 32 nm, 28 nm, 20 nm and down to 10 nm, many devices are using metal for the gate electrodes. Preferably, the gate electrodes of each of the transistors is a metal gate electrode composed of a metal of the type available and expect to be used in process technology of the 28 nm size and smaller. Metal gate electrodes for use in very small transistors, below 45 nm, have been published by both IBM and Intel in various well-known publications, and any of the metal gate designs they propose are acceptable and could be used in this invention. (For example, gate electrodes may be made of Ti, TiN or alloys thereof.) Normally, this metal layer is labeled metal 0, sometimes M0 and is so labeled herein. The arrangements of the gate electrode in straight contiguous lines in the form of rectangles is also beneficial for using either metal or polysilicon for the gate electrodes. The design can therefore easily be adapted between polysilicon and metal, even though the arrangement shown has particular advantages in permitting the use of a metal gate electrode as M0.

Figure 8:
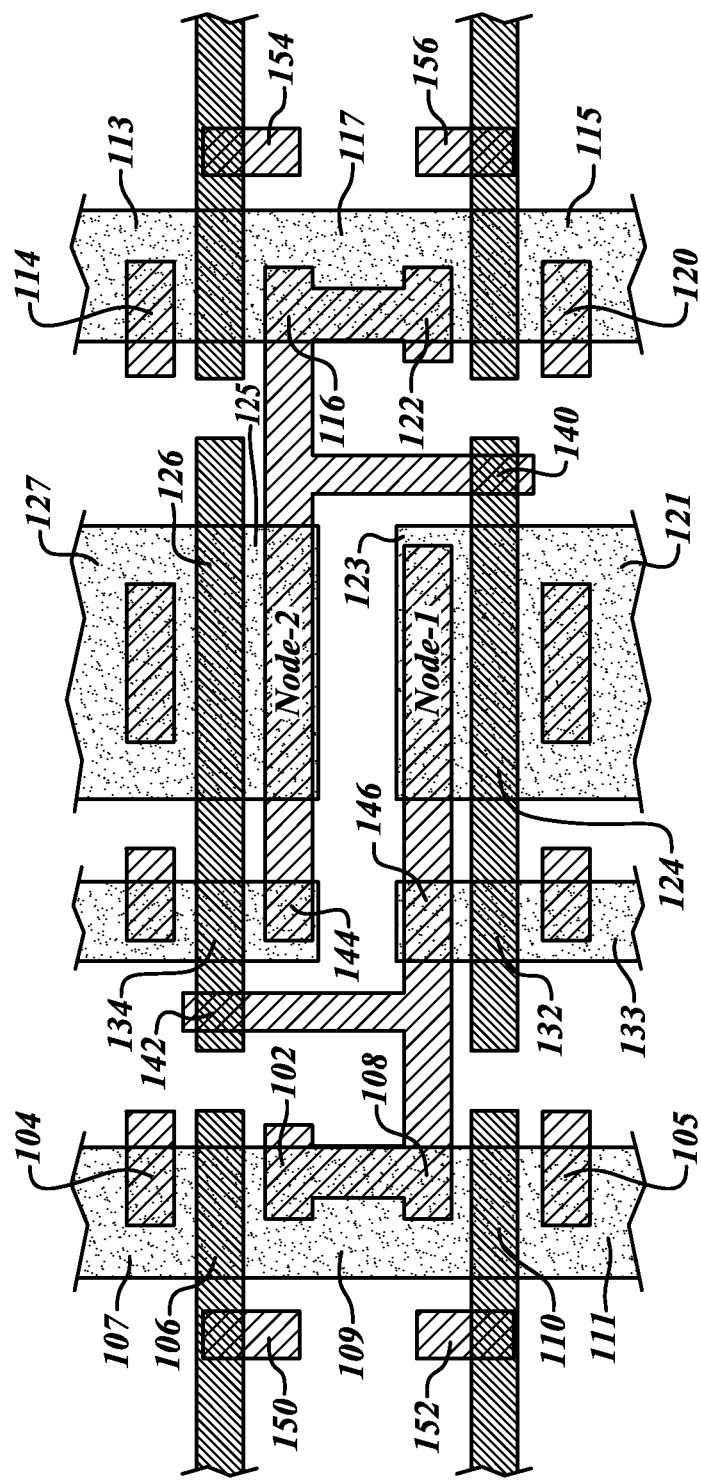
FIG. 8 is a top side view of the layout of the memory cell according to FIG. 7 having an additional layer of metal 1 shown therein.

FIG. 8 shows metal layer M1 added to the layers shown in FIG. 7. The metal layer M1 physically contacts and electrically couples to all layers directly below it. As shown in FIG. 8, no contacts or vias are provided nor are they necessary. Namely, where the layer M1 overlays on top of an active area, it is in electrical and physical contact with the active area at all such locations. Where the layer M1 overlaps and lays on top of the gate electrode, which may be M0 or, in some embodiments, polysilicon, it also physically and electrically connects to the gate electrode. The metal layer of M0 can be composed of any acceptable layer of metal or laminated layers as is known in the art. For example, M0 can be an Al alloy with a thin layer of Ti, TiN or TiMo layer below it, all layers together making up M0. Normally, metal layers are composed of two or more sublayers that act as a single laminated layer to provide the metal layer and a construction of M0 in which one of the laminated layers is in physical contact with the active area and a sublayer above it forms additional conductive structure of M0 is standard and acceptable for use in the embodiments herein.

By applying M1 over an active area, electrical connection is made for the entire area of the overlap of M1 to each of the respective source drain regions of the eight transistors in the memory cell. In addition, electrical connections are made at specific locations that will become the access for port A and port B wordlines which will be used for later via connections as explained later herein with respect to FIGS. 9-12.

The active areas 109 and 117, respectively, of the pass gate is continuous. This is a substantial benefit in that it alleviates the shallow trench isolation stresses which impact on very small width devices. Therefore, the electrical isolation structures between the pass gates used in other SRAM designs are not needed according to the layout herein in the active area arrangements for the pass gates.

A further distinct advantage is that all of the internal node connections are done below the first M1 routing. The contact to the active areas to cross-couple the various active areas to each other is done by direct physical connection of M1 to the substrate active area regions in this embodiment. Therefore, contacts and vias from metal 1 to active are not required further eliminating the need for connections which are high in resistance and take up a large amount of cell area. The cell can be made substantially smaller by avoiding the use of vias between M1 and active area and M1 to M0. Therefore, all the internal node connections to complete the electrical shape of the memory cell are done below the first routing resource. This provides a benefit in which the alignment can be easily adapted to single port SRAM cells and would be beneficial across a wide range of technologies.

A further benefit is that there is no sharing of active regions between the pass gates and the pull down transistors. In the prior art, there was a problem with such sharing of active areas because the pull down transistors PD-1 and PD-2 traditionally have to be relatively large to provide a high current path to Vss. On the other hand, the pass gate transistors having their gate electrodes coupled to the wordlines traditionally can be smaller, with lower W/L ratios than is needed for the pull down transistors. Therefore, the two transistors, pull down and pass gate, can each be customized to the desired shape and size to perform its particular function without having to be concerned about the conflicting requirements of having the common active area perform the same function for two different transistors. This avoids the use of commonly used L or T shaped active regions which are often used in many prior art SRAM cells. This also permits the SRAM cells to be formed with all active areas as simple rectangles.

The interconnection between the various active areas is carried out through M1, which has large contact area to active and very high conductivity to provide an effectively very low resistance between all of the active areas. Since metal is substantially more conductive than silicon, the use of M1 in direct physical contact with the three active areas for the pull up transistor, the pull down transistor and the pass gate to form each of the respective nodes provides substantial benefits in speed, small size and low resistance connections. The resistance between the pull down transistors can, in some instances, be made lower than the prior art efforts which attempted to use a common semiconductor diffusion in the active area to provide this function.

In one embodiment, metal 1, called M1, is a blanket layer deposited over exposed conductive layers without the use of contacts or vias. The layer, after being blanket deposited, if patterned and etched to remove it from all locations in which an electrical connection to M1 is not desired. This use of M1 provides full electrical connection of all internal routing of the memory cell without the use of contacts or vias, thus substantially reducing the size of the cell and increasing the performance in both speed and current carrying ability. In a preferred embodiment, M1 is deposited, patterned and etch in two different layers, each having the same material, but each creating patterns of perpendicular to each other.

FIG. 8 is labeled with corresponding reference numbers from FIG. 6 and FIG. 7, as will now be explained. As can be seen, viewing FIGS. 6, 7 and 8 together, pass gate PG-1 has gate electrodes that provide access to 106 to node 1. Metal layer M1 at location 102 which is in direct physical contact with the diffused region of the substrate in active area 109. The pass gate to port B couples to node 1 at location 108 and, as can be seen in FIG. 8, which is a common metal layer with region 102 which is also common with node 1. Node 1 continues as a common metal strip to couple to the drain 135 of P-channel transistor PU-1 and also is coupled to the drain 123 of the pull down transistor PD-1, all of them together making up the node 1. In addition, as can be seen, metal 1 also overlays the gate connection at node 142 to be coupled to the common gate 126 of pull down transistor PD-2 as well as the gate 134 pull up transistor PU-1.

Node 2 is composed in a similar, fashion to node 1. Namely, node 2 is coupled to the common source/drain region 117 of the $\overline{A}$ and $\overline{B}$ bitlines at nodes 116 and 122. There is a common metal strip which extends across node 2, to node 144 which is the drain 139 of the pull up transistor PU-2. The same common metal strip is the common gate 132 and 124 of the pull up and pull down transistors, respectively, and node 140 as can be seen FIG. 8. Access is provided to node 2 from port A at the contact made location 114 and from port B at the contact made at 120. Metal layer M1 also has electrical and physical connection to the gate electrodes of the pass gate transistors at crossover points 150, 152, 154, and 156, which will be used for electrical interconnections later as explained with respect to FIGS. 9-12. In addition, M1 strips are formed on active area at locations 104, 105, 114 and 120 which will be used in later steps as explained herein. An electrical isolation, such as STI, is positioned between the active areas in the substrate, and when M1 is on the STI, it is therefore electrically insulated from the bulk substrate.

As can be seen in FIG. 8, node 1 is made up of a common electrical node that includes a large metal strip as the single contiguous member that overlays the source/drain diffusion of the pass gates, the drain diffusions for the pull up transistor and pull down transistor, while also linking to the gate of the transistors that control node 2. The use of a single metal strip that provides direct physical and electrical contact, without the use of vias provides significant advantages over the prior art. The internal node connections are made using a first routing resource, metal 1, without the need for vias or vertical contacts. This substantially reduces the cell size while at the same time reducing the resistance of the connections and providing a large area for storing charge in node 1. As will be appreciated, all of node 1 is at the same electrical potential and the use of a single metal strip to tie three diffusion areas together provides a large area in which the data can be stored and retained for long periods of time without parasitic losses of the data. Similar effects are obtained in node 2 as will be apparent by viewing FIG. 8.

The metal layer M0 can be deposited by two alternative techniques, depending on the design. In one embodiment, the layer M0 as shown in FIG. 8 can be deposited as a single metal layer contiguous in all regions. Alternatively, the metal M0 is deposited, then patterned and etched in two separate series of steps, using two different masking steps. After a first deposition, the horizontal straight line extending portions of M0 are patterned and etched with all lines and edges of all segments extending parallel to each other and having no turns. For example, as can best be seen in FIG. 8, sections 114 and 104 formed at the same time as the regions that make up 102, segment 168, and the horizontal segment of node 1. In a subsequent, following deposition of metal 1 again, and a further pattern and etch process, the vertically running segments of M1 are formed. In this second set of steps, all portions of M1 are also parallel to each other at all edges and run in vertical column lines. These portions include sections 150, 152, 154, 156 as well as the vertically extending portions of node 1 and node 2, as indicated at the connections to 140 and 142. In addition, the vertical strip between 108 and 102 as well as the vertical strip between 116 and 122 is deposited. The deposition of metal layer M1 in two different steps provides advantages for small device sizes. For example, in device geometries of 28 nanometers and lower, many design rules prefer to not have bends, turns, or sharp internal corners in the patterns used to form thin strips. Accordingly, by depositing in two different layers than etching each layer with different masks, each masks can be composed of purely horizontal lines that are exactly parallel to each other and run straight, with no bends, curves, or internal corners. A second deposition, also of metal 1, can be formed to run in the perpendicular direction to the first pattern and overlap at those locations of metal 1 where electrical connection is desired in order to form the final shape shown for metal 1 in FIG. 8. Accordingly, in a preferred embodiment, metal 1 is deposited in two different pattern steps, while it still forms a single conductive layer compose of a plurality of sublayers or laminated layers on top of each other.

Figure 9:
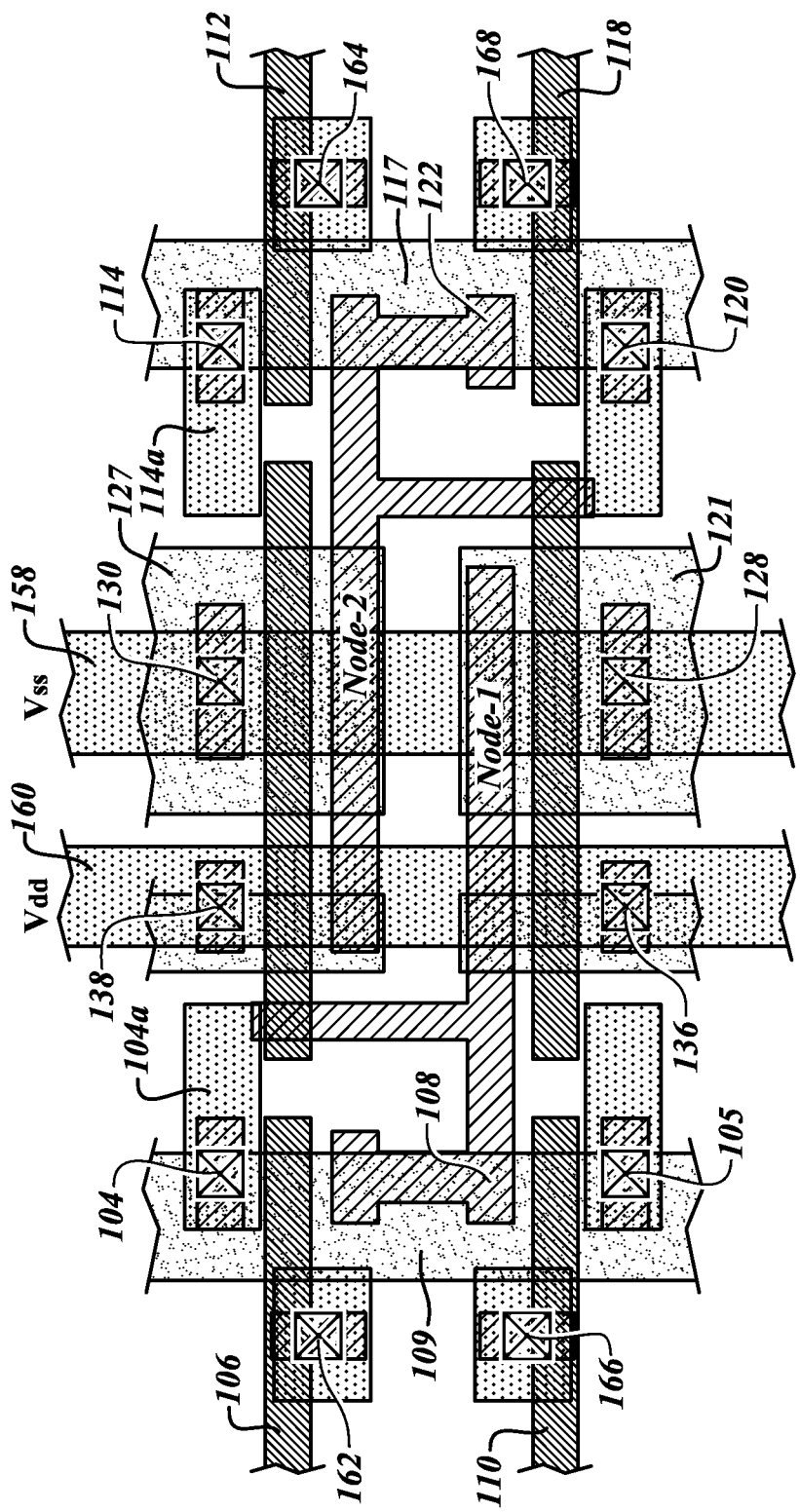
FIG. 9 is a top side view of the layout as shown in FIG. 7 with the addition of metal 2 and the appropriate contacts and vias.

FIG. 9 illustrates the next metal level M2 being formed in the memory cell. As will be appreciated by those of skill in the art, a number of insulating layers are formed overlying M1 to prevent electrical interconnection between M1 and M2. In those locations in which it is desired to have interconnection between M1 and M2, a via is formed, as will be explained with respect to FIG. 9. In those locations in which M2 overlaps electrically conductive locations in FIG. 9, there will be no electrical contact unless a via is present. Therefore, M2 is different than M1 in this important aspect, namely M1 forms electrical interconnections without the presence of a via because of the direct physical contact on the layers below.

The electrical structure of FIG. 9 as compared to FIG. 6 will now be explained, with common reference numbers being used. For ease of reference, and to avoid confusion, only some of the reference numbers are used from FIGS. 7 and 8, and many will not be present. Rather, only some reference numbers will be added in order to clearly show the electrical connection between the relevant features of FIG. 9 and the circuit as shown in FIG. 6.

M2 is used to form the power supply lines, Vss strip 158 and Vdd strip 160. These are labeled in FIG. 6 as well as Vss source 158 and Vdd source 160. In order for the memory cell to be coupled to the various power supply lines, vias are formed between metal 2, and metal 1. As previously explained, metal 1 is in direct physical contact with the substrate and therefore an underlying contact/via is not necessary. In FIG. 9, the contact from the source 121 of PD-1 to Vss is provided through via 128 whereas the electrical contact to the source 127 of PD-2 is provided at via 130. These locations are also labeled in FIG. 6 as can be seen by comparing the electrical circuit of FIG. 6 to the physical layout of FIG. 9. Similarly, Vdd provides power to the cell using a first via 136 coupled to the source of pull up transistor PU-1 and a via 138 coupled to the source of pull up transistor PU-2. (The N-well is not shown in FIG. 9 for ease in understanding the figure although of course, it remains present as shown in FIG. 7.)

As can be seen in FIG. 9, the metal strip 158 making up Vss is approximately 20% wider than Vdd. For reliable and rapid circuit operation, a very low resistance connection with high current carrying ability to Vss is desired for an SRAM memory cell. In a dual port SRAM, lower resistance and high current carrying capability is even more important. As previously noted in the background, the N-channel pull down transistors have to carry a large current in order to be ensured of reliable data storage and to provide simultaneous access for the port A and port B bitlines. Accordingly, the N-channel transistors are made substantially larger than any other transistors in the memory cell and the Vss connection to these transistors is also made the largest metal connection within the memory cell with respect to its width and therefore provides correspondingly lower resistance. The active area forming the drains 123, 125 is also made large to provide better memory retention during simultaneous access of the cell. This particular memory cell is beneficial in that Vss can be made even wider than shown in FIG. 9. Namely, the width of Vss metal line 158 can be extended to be up to twice or perhaps three times larger than that shown in FIG. 9 because space is available until it abuts against other portions of metal 2 to which it is supposed to be electrically isolated. Accordingly, Vss could be expanded to be closely adjacent to metal line 160 which makes up Vdd within the electrical design limits to ensure electrical isolation between the two. In addition, Vss could be extended on the right to be closely adjacent to other metal 2 portions 114a and 120a so long as it is spaced sufficiently far to remain electrically isolated. The placing of Vss in the center of the cell with an arrangement that has other portions of M2 spaced far from it provides great latitude to the individual cell designer to make Vss relatively large and having a corresponding lower resistivity and higher current carrying ability. The source power supply line, Vss is positioned in the center of the cell and coupled at two locations inside of each cell, to the sources of the pull down transistors. The sources of the two pull-down transistors are separate from each other and not in the same active area. The source power supply line is located at a position relative to the other power supply line, Vdd and to the bit lines that is can be made quite wide to provide lower resistance and faster speeds. The current carrying capability of Vss is high as compared to the bit lines to permit two different bit lines to access the data storage nodes, either concurrently or simultaneously, and still retain the correct data as valid. In addition, in one embodiment, the current carrying capability of Vdd is also high as compared to the bit lines to permit two different bit lines to access the data storage nodes, either concurrently or simultaneously without loss of data.

As can be seen in FIG. 9, the metal strip 160 for Vdd runs parallel to Vss. It could also be made somewhat wider than as shown in FIG. 9. Electrical insulation layers will be positioned between Vdd and Vss as well as other portions of the M2 layer to keep them electrically isolated from each other. Each portion can extend larger in width as appropriate within the design rules sufficient to ensure electrical isolation between the different portions of metal 3. FIG. 9 also shows that metal 1 and metal 2 cooperate to provide access of the port A wordline and the port B wordline to the gates of the respective pass transistors. A via is formed between metal 2 and metal 1 at location 162 in order to provide access to the gate 106 of pass gate PG-1. Similarly, a via is formed at node 164 in order to provide access to the gate 112 of pass gate PG-3 of port A for the wordline. Similar via connections are made at locations 166 and 168 in order to provide access to the port B wordline as will be shown later with respect to FIGS. 10 and 11. In addition to preparing for the wordlines to come later, vias are also formed in preparation for the bitlines which will come in later metal layers. Namely, vias are formed at locations 104, 105, 114, and 120 so that when the bitline is later formed, electrical connection can be provided to the data nodes to store and read data. The layer M2 also has areas extending from the bit line contacts at locations 104a and 114a which will be used later.

Figure 10:
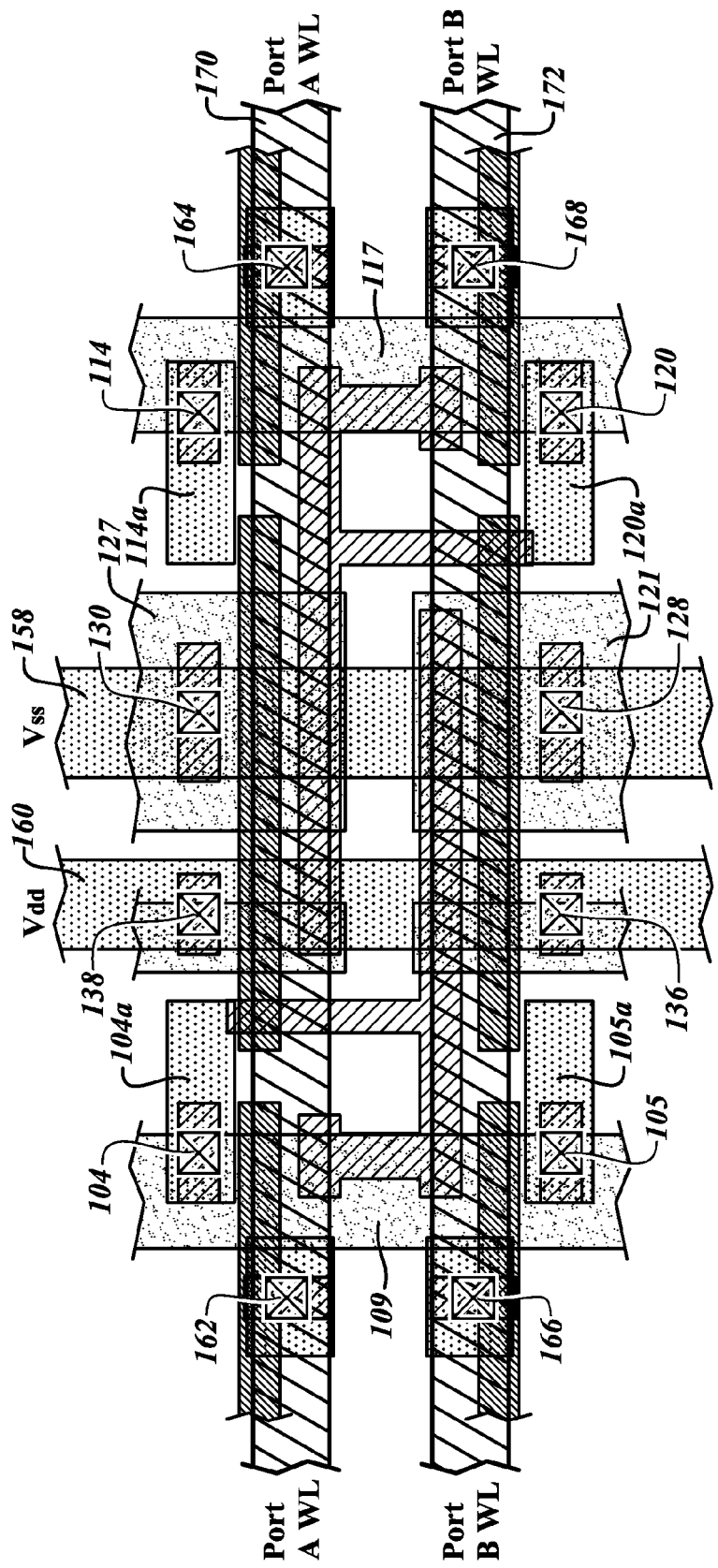
FIG. 10 is a top side view of the layout as shown in FIG. 9 with the addition of metal 3 together with the appropriate contacts and vias.

Turning now to FIG. 10, metal 3, M3 provides the access to the memory cell by the wordlines. In FIG. 10, wordline strip 170 provides access to port A wordline and 172 provides the port B wordline. These wordlines are coupled to the memory cell via the pass gates at via locations 164 and 162 for the A wordline and at 166 and 168 for the B wordline, as previously explained with respect to FIG. 9. The use of metal 3 to provide only the wordlines and not to provide Vss or the bitlines has a number of distinct advantages over memory cells of the prior art. The speed of an SRAM is determined in part by the resistivity and capacitance of the wordlines. The lower the capacitance and the lower the resistivity of the wordline, the faster the response of the memory cell. Metal 3, being used for this particular memory cell and having its only function to provide the wordline, provides a significant benefit in both of these functions. The wordlines 170 and 172 can be positioned equidistance from a central region of the cell and spaced sufficiently far from other metal layers to avoid a large amount of capacitive coupling. As can be seen, the wordlines 170 and 172 pass over lines 160 and 158 for only a small area making up Vdd and Vss as the next adjacent below layer, however, all other metal layers are two or more layers below and therefore capacitive coupling is substantially reduced by avoiding having metal present in the next adjacent metal layer passing directly underneath the wordline for a substantial part of the wordline. The avoidance of capacitive coupling and substantially reducing the overlap of directly adjacent metal layers by the wordline is a substantial benefit of the present memory cell. In addition, the wordlines can be made substantially wider if desired in order to greatly reduce the resistance. As can be seen, a large area in the central region of the memory cell as well as areas above and below are open at the metal 3 level. Thus, if desired, the wordlines 170 and 172 can be made substantially wider, up to double that shown in FIG. 10, to have lower resistance, thus increasing the speed and the current carrying capability of the wordlines 170 and 172.

In FIG. 10, as with FIG. 9, not all the reference numbers from the prior figures are carried over in order to avoid confusion and to reduce the difficulty in reading the figure. Rather, only a few of the reference numbers are repeated in FIG. 10 from the prior FIG. 7 to avoid difficulty in reading the electrical circuit and those various layers which are shown in FIG. 10.

Figure 11:
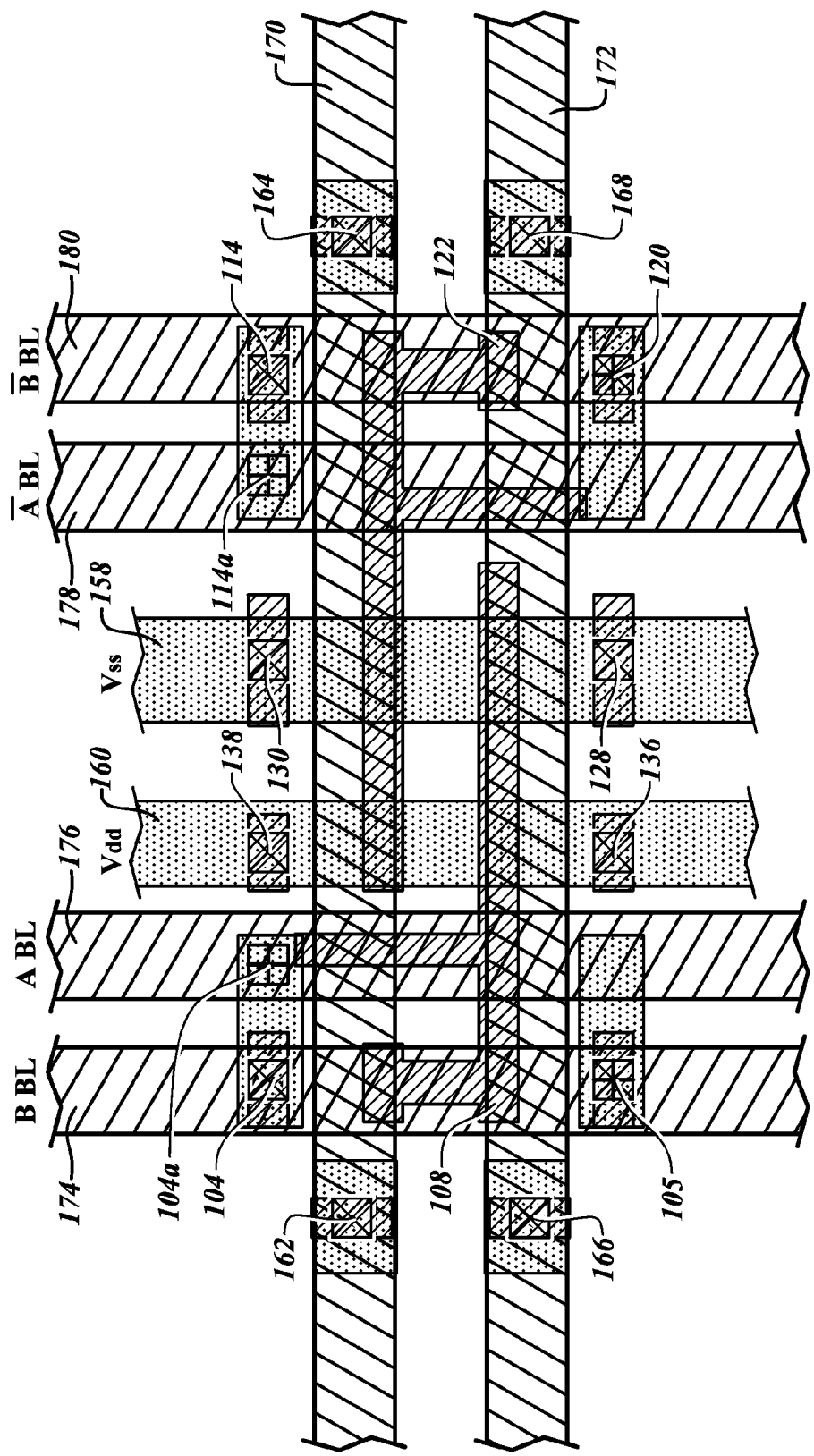
FIG. 11 is the memory cell layout of FIGS. 7-10 showing only the metal layers and none of the underlying layers in the substrate.

FIG. 11 illustrates the bitlines being formed in the next metal layer, metal 4, sometimes referred to as M4. In FIG. 11, all metal layers above the gate electrode are shown. Namely, metal layers M1, M2, M3, and M4. In order to avoid confusion, and make the metal layers easier to view, the active areas in silicon as well as the gate electrode are not shown in FIG. 11. The bitlines are formed in metal lines 174, 176 for the true bitlines and metal lines 178 and 180 for the complimentary bitlines, sometimes called the false bitlines or bitline bar. The bitlines are at the outer regions of the cell and electrically connect to the cell at the appropriate via nodes as will now be explained.

Bitline A couples to metal 2 and a node 104a which is electrically identical to node 104. Node 104a is at a via that couples M4 to M2 and as can be seen, M2 is electrically coupled by the via 104 to metal M1 and thus to the source/drain region of the pass gate PG-1. The use of M2 in an extension 104a to provide the electrical interconnection of the A bitline to the via 104 to M1 is particularly advantageous for the dual port SRAM memory cell according to principles of the present invention. Two bitlines are able to extend parallel to each other, side-by-side for an extended distance, and by use of the intermediate metal layer, in this embodiment M2, to provide an interconnection wiring layer to couple a higher metal level bitline to the low level region of the diffusion 107 in the substrate that makes up the source/drain region of the pass gate transistor, a compact memory cell can be formed with low resistance connections to the bitlines.

In the case of the B bitline, the metal strips 174 for the B bitline passes directly over metal coupled to node 105 and therefore a via is formed from M4 directly through to M2 stacked vertically on top of each other. In the embodiments shown, M2 does contain an extension 105a sufficiently wide that it extends underneath the metal strip 176 which forms the A bitline. In this embodiment, no electrical connection is made at location 105a between the electrical node 105 and the A bitline of metal strip 176, there being at least two layers of dielectric material in between them. It could be easily achieved to change the connection and provide an electrical connection to this bitline if desired according to the cell layout because of the convenience in the location of the various metal layers. Of course, the metal layer at node 105 can also be made considerably smaller so that the cell is not symmetrical on the top and bottom. However, in one embodiment, the cell is made symmetrical about its horizontal center axis (except for the shape of M1) so as to be a mirror image of the active, M0, M2, M3 and M4 layers along a horizontal line passing through the center of the memory cell. The bitline bar to perform $\overline{A}$ and the $\overline{B}$ bitlines are formed of metal strips 178 and 180 which connect to the data nodes in a manner similar to that described with respect to bitlines A and B. Namely, bitline $\overline{A}$ couples to a node 114a by a via to metal 2 which provides electrical connection to via 114 to the source/drain region of pass gate PG-3. Metal strip 180 forming $\overline{B}$ bitline is electrically connected by a via 120 through to M2 and through to M1.

Viewing FIGS. 8, 9, 10 and 11 together provides an understanding of why different portions of the metal layers are formed in each of the locations in the various steps, even though electrical connection is not made until later steps in the process of forming the memory cell. For example, viewing FIG. 8, metal strips 150, 152, 154 and 156 which electrically couple to the wordlines are used when M2 is applied as shown in FIG. 9. A via is formed to each of these locations so that the M1 metal locations at 150, 152, 154 and 156 are coupled by respective vias 162, 166, 164 and 168 to M2. Still, at FIG. 9 these locations remain electrically isolated from other portions of the circuit. When metal layer M3 is added to provide the wordlines as FIG. 10, the previously formed metal portions 150, 152, 154 and 156 are now useful to provide electrical interconnections from the metal strips 170 and 172 that make up the wordlines to the gates of the respective pass transistors PG-1 to PG-4. Similarly, in FIG. 8, metal M1 is formed with overlapping strips in the source regions of the pull up and pull down transistors. In FIG. 9, when metal M2 is applied in metal strips 158 and 156 to provide Vss and Vdd, these metal 1 locations are used for the electrical interconnection vias of 128, 130, 136 and 138. In a similar fashion, at the formation of M2 extended portions 104a, 105a, 114a and 120a are provided at nodes 104, 105, 114 and 120 which will be later used in the bitlines when M4 is provided as can be seen in FIG. 11.

In FIG. 11, a box with a cross in it indicates a via connection between metal 4 and metal 2 whereas a box with an x in it indicates a connection between metal 1 and metal 2 and metal 2 and metal 3. Thus, nodes 104 and 114 are not electrically connected to the bitlines 174 and 180 which pass directly thereover and instead, are electrically isolated therefrom. In those situations in which a metal 4 bitline is directly connected to and on top of an electrical connection to metal 2, then both symbols are used together, a box with both an x and a cross in it as can be seen at nodes 105 and 120 in FIG. 11. Thus, electrical connection is provided via bit lines B and $\overline{B}$ from metal 4 to the respective source drain diffusions of the pass gates PG-2 and PG-4.

According to one embodiment, four metal layers are provided in the memory cell, namely, M1 to provide the local interconnect, M2 for Vss and Vdd, M3 for the wordlines and M4 for the bitlines.

As can be seen viewing FIG. 11, the memory cell may also be laid out having only three metal layers. If the layer which is M1 is composed of polysilicon, then two metal layers can be used to make the entire memory cell. It is expected that the present inventive memory cell will find use mostly as an embedded SRAM as part of a microprocessor. According, the process technology used to make the microprocessor, whether two, three or four metal layers or gate electrodes of poly or metal will be used to make the SRAM in the same process steps that are being used to construct the logic elements and transistors of the microprocessor.

Viewing FIG. 11 it can be seen that the bitlines do not overlap with Vss and Vdd. In one embodiment, the bitlines and the power supply lines are formed in the same metal layer, either metal 2 or metal 3. The bitlines are all parallel to each other, as well as being parallel to the voltage potential lines Vdd and Vss. Accordingly, if all are formed in the same metal layer, the appropriate design rules for maintaining electrical isolation between them can be followed by depositing a dielectric layer in between them and maintaining sufficient distance that they do not electrically interact with each other. Thus, in one embodiment, one less metal layer is used in the memory cell.

Figure 11A:
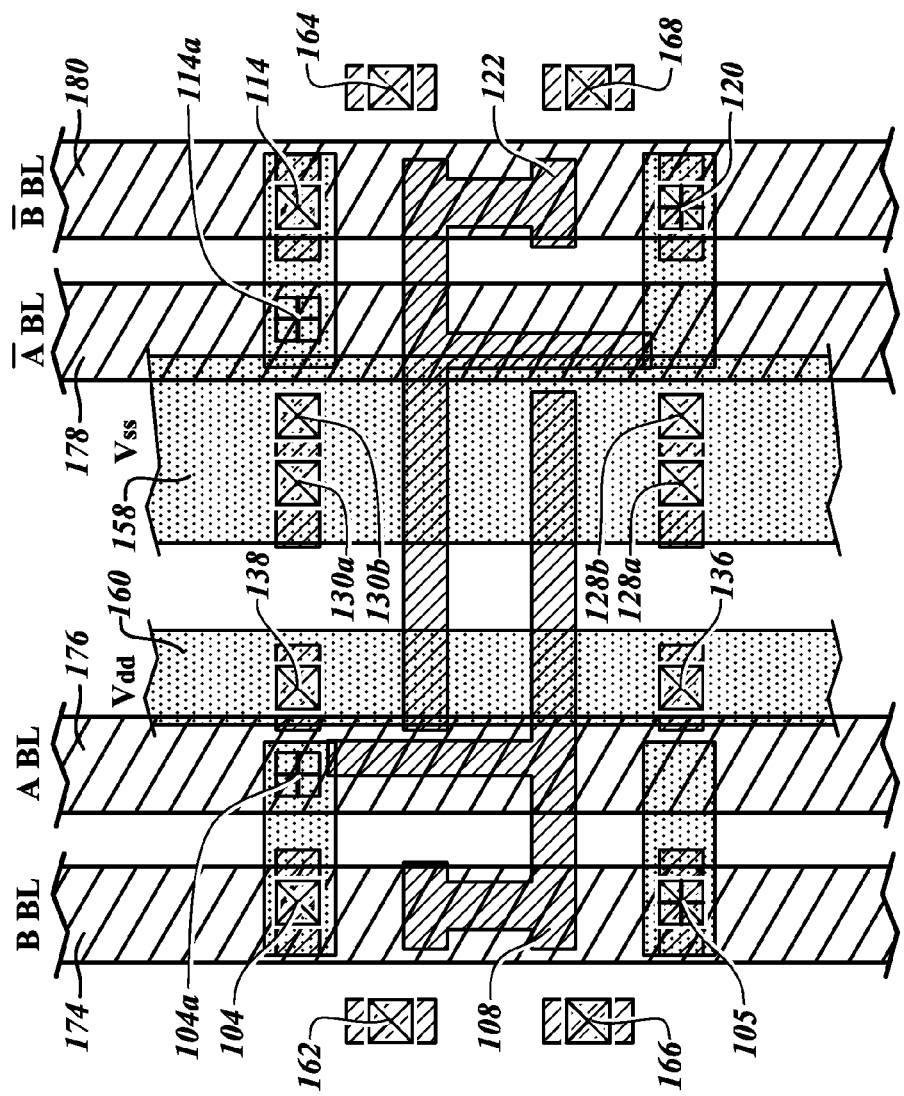
FIG. 11A is an alternative embodiment of the memory cell layout of FIGS. 7-10 showing a more compact memory cell and a wider Vss line.

In the embodiment shown in FIG. 11A, the bitlines are in a separate metal layer than the power supply lines. This provides some distinct advantages with respect to access speed and low resistivity, even though the process is slightly more complex. As can be best appreciated by viewing FIG. 11A, the metal line Vss can be made sufficiently broad that it extends near bitline $\overline{A}$ and, in some embodiments overlaps the adjacent bit line so that the bit line overlays the power supply lines. Vss is also more closely adjacent to the Vdd line. Similarly, Vdd can be made substantially broader that it extends under much of the A bitline and perhaps under a portion of the B bitline. In addition, the various bitlines could also be extended to be somewhat wider than is now shown and can overlap Vdd and Vss which are in different metal layers and are separated by two levels of dielectric layers between the bitlines and the power control lines. As will be appreciated, a single inter-metal dielectric layer may be made of multiple sublayers, such as silicon nitride silicon dioxides, nanoporous silicon and other low-k dielectrics. In between metal 2 and metal 4 there are two levels of intermetal dielectrics, thus greatly reducing the capacitive coupling which may occur between these two metal layers.

FIG. 11A illustrates this alternative embodiment, as will now be explained. FIG. 11A shows one alternative embodiment in which an enlarged Vss line 158 is provided. A slightly enlarged Vdd line 160 is also provided though not as increased as that of Vss. As can be seen in FIG. 11A, the Vss line is expanded sufficiently that a portion of it is under the $\overline{A}$ bitline and two vias 128 are provided for electrical connection to the respective source regions 121 and 127 below. In a similar fashion, the Vdd line 160 is also enlarged, though not as much larger as the Vss line 158. The Vss line 158 can therefore have a range of widths, preferably 40%-80% wider than the bitlines, and in one embodiment more than double the width of the bitlines. The range for the Vss line therefore can be any width between that shown in FIG. 11 and shown in FIG. 11A. In addition, a single contact 128 can be shown as illustrated in FIG. 11 or, alternatively, if even greater current density is desired, two or more contacts can be provided as shown in FIG. 11A. In addition, FIG. 11A shows the result of the active areas 107 and 109, and thus the bit lines, being moved closer to each other and closer to the center of the memory cell, making the memory cell more compact. The memory cell of FIG. 11A thus has an aspect ratio of less than 2.5 while being of the same basic design and structure. If the bit lines are brought even closer to each other to directly overlay all of Vss and Vdd and the active areas of the various transistors are formed as close to each other as the design rules permit, then dual port SRAM having an aspect ratio of less than 2 and approaching 1.5 can be formed. (As will be appreciated viewing FIG. 7, the various active areas are not all as close to each other as the design rules would permit, with the areas 107 and 109 being spaced farther from areas 123/125 and from 135/139, respectively, than the design rules permit. Note that in this design, reducing the spacing to the closes permitted by the design rules has the effect of reducing the aspect ratio, thus improving the performance of the memory cell.

FIG. 12 illustrates all conductive layers of the memory cell as present in the final dual port SRAM structure. The dielectric layers are not shown to avoid confusion and for ease of understanding, however, as will be appreciated, the appropriate dielectric layers are formed in between each of the electrically conductive layers and portions thereof in order to provide electrical isolation, as is well known according to the design rules. In FIG. 12, many, but not all of the reference numbers from the prior figures are included, though some of the reference numbers are left off for ease of viewing the figure and understanding the operation of the circuit. While viewing FIGS. 7-11 together gives an understanding of the different individual portions of the memory cell, FIG. 12 provides all the layers and full interconnection and circuit operation. Bitline A 176 and bitline B 174 couple to the memory cell at connections 104a and 105, respectively. Similarly, bitline $\overline{A}$ 178 and bitline $\overline{B}$ 180 couple to the memory cell at locations 114a and 120, respectively.

Similarly, $\overline{A}$ and $\overline{B}$ bitlines electrically couple to the memory cell via pass gate transistors PG-3 and PG-4. As can be seen viewing FIG. 12, when the A wordline goes high, the data stored at node 2 is electrically connected at metal line location 122 to the bitline $\overline{A}$ while the data in node 1 is electrically connected via metal line 108 to the bitline A by passing through nodes 104, 104a. Thus, taking a single wordline high couples both data and data bar to the respective bit lines. In a similar manner, when B wordline goes high, the data stored in node 1 is coupled to the B bitline from metal line 108 to via 105 and the B bitline from node 2 at metal line 122 to via 120.

In some of the embodiments shown and described herein, the word lines are provided in M3 while the bit lines are provided in M4. In other embodiments, it is preferred to have the bit lines in M3 and the word lines in M4. Having M3 for the bit line and M4 for the word line provides some advantages for the bit line to make contacts to the pads and in other metal connection layers, for example, to reduce the vertical step distance and connections for the bit line to couple to the data node. Therefore, in some embodiments, the bit lines are formed in M3 and the word lines in M4, with the appropriate changes in vias and contacts made in FIGS. 10-12.

In other embodiments, as discussed herein, the bit line can be in the same metal layer as Vss and Vdd or in a different metal layer. Similarly, the bit line can be in any appropriate conductive layer, whether M1, M2, M3, M4, and if present on the chip, M5, M6 and so on. Power supply lines and the word lines can be any one of the available conductive layers, from M1 to M5 or other available conductive layers on the chip. In some instances, the word line might be in M0 or in polysilicon as well. The particular metal layer selected for power, bit lines and word lines can be based on the available metal lines in the process technology used for the chip since dual port SRAMs of this type are most often used as embedded SRAMs on microprocessors and the same process technology used to fabricate the microprocessor circuits will be used to fabricate the dual port SRAM of this invention. Thus the selection of which metal line to use for the bit line, word line and power will based in part on the available metal lines of the particular process used and also the use of those metal lines in microprocessor section of the chip. As one example, Vss and Vdd will be always be provided to the microprocessor section of the chip. If these are provided in M2 to the microprocessor, it will be most convenient provide them as M2 in the dual port SRAM of this invention. But, if they are provided in M3 or M4, it will generally more convenient to provide these as the corresponding metal layer in the dual port SRAM and use M2 for another connection, such as the word line or the bit line. Vdd and Vss can be in the same metal layer or different metal layers from each other. In addition, if M3 or M4 is used for the bit lines in other standard SRAM cells on the chip or for DRAMs or EEPROM, it may be preferred to use the same corresponding metal layer for the bit lines in the dual port SRAM. Similarly, if one metal layer, such as M2, M3, M4 is used as a word line in other memory cells in other locations on the die, then it is preferred to use that same metal layer for word line in this design. Thus, the particular use of each metal layer can be selected based on the most convenient choice for the process technology available and the use those metal lines in other portions of the chip.

FIG. 13 illustrates two complete memory cells that make up the array of dual port SRAM memory cells which illustrates the compact nature of the memory cell as well as the ease of repeatability and the formation into a dense array. In one embodiment, the memory cell as shown in FIG. 12, is produced in a step and repeat pattern to form the entire array. Namely, the single memory cells is stepped horizontally one unit to the left or right and repeated to form the pattern. In addition, the unit memory cell may be stepped vertically up or down in repeating the pattern. The layout is specifically selected to permit an easy step and repeat pattern so that the memory cell having a rectangular profile and a low aspect ratio can be formed as a dual port SRAM cell. As will be appreciated, the same type of layout could be used as a single port SRAM cell and significantly reduce the aspect ratio because two of the bitlines and one of the wordlines are not needed.

In FIG. 13, some, but not all, of the reference numbers are repeated from the earlier figures in order to avoid distraction and confusion. A simple description of FIG. 13 will now be provided, although it will be appreciated that it is composed of all the layers shown in FIG. 7-11 combined and the description provided in those prior figures is also applicable to that circuit which is shown in FIG. 13. A source line contact 128 is common to two memory cells, the memory cells above and below the cell of the particular row. Similarly, the source line contact 130 is shared by two memory cells, the cell of the row shown as well as the cell above. In a similar fashion, the Vdd connection is shared between the two memory cells, with the connection 136 being shared between the present cell and the one in the row below and the connection 138 being shared by the cell of the present row and the one above.

Vss provides a common line 158 that extends along a column of memory cells to provide the ground connection to all memory cells in the column while the power line 160 extends along the same column, parallel to the source to provide Vdd connections to all memory cells in that particular column. The source and drain lines 158, 160 are repeated in a parallel fashion for adjacent columns as will be apparent to those of skill in the art even though only a portion of the memory cell is shown. Bitline 176, 174 provide access to the memory cells of the A bitline and B bitline, respectively, while metal lines 178, 180 provide access to the memory cells of the $\overline{A}$ and $\overline{B}$ bitlines, respectively. On the far right-hand side of FIG. 13, the metal strip 174 for the B bitline of the next memory cell is shown and therefore is appropriately labeled 174, while on the far left-hand side, the $\overline{B}$ bitline of the next adjacent memory cell to the left is shown and thus is labeled 180. Wordlines 170, 172 extend through the memory cell to enable the pass gates. As can be seen, the wordlines 170, 172 alternate with respect to each other through the memory cell array to provide access to the pass gates PG-1, PG-3 and PG-2, PG-4, respectively.

Viewing FIG. 13, it can be seen that the port A wordline provides simultaneous access to two memory cells at a single contact location. For example, at via 162 the A wordline 170 enables the pass gate for the present memory cell as well as for the memory cell to the left. Similarly, via 164 provides access to two pass gates from the single via, the pass gate to the present memory cell as well as to the adjacent memory cell to the right. In a similar fashion, a single via from the port B wordline provides access to two memory cells at vias 166 and 168.

A common source diffusion 127 is formed between adjacent memory cells vertically above and below for a ground connection to the pull down transistors and a common source power connection line 137, 133 is formed for the power supply node via line Vdd between adjacent memory cells above and below.

Isolated diffusion 123, 125 provide a portion of the nodes that will store the data at node 1 and node 2, respectively, as previously described.

While the memory cell as shown in FIG. 13 is shown and described as a step and repeat pattern of the memory cell, it will be appreciated that could also be mirror imaged about a central node, for example, about a center Vss contact 128 either mirrored along a horizontal axis, or along a vertical axis, by the appropriate arrangement of the shape of the various diffusions, metal one and active interconnect areas.

A memory cell laid out according to the present invention has the following advantages which significantly increase the speed as well as provide more compact storage of data than the prior art arrangements. The performance is improved in the range of 10-20%, and in some embodiments, in excess of 20% due to the following. There is a reduction by greater than 50% of the wordlines RC time constant due to the shortened wordline run length and the ability to use wider metals in the wordline. This provides significantly increased speed and less capacitive coupling than is present in other cell designs. In addition, there is improved cell current, in the range of 15%, based on the following beneficial arrangements. There is no resistive current path through poly to an elongated contact, an estimated gain of greater than 10% through circuits which use such a resistive contact. Instead, as pointed out, there is direct physical connection between metal 1 and the active areas without the use of vias. In addition, there are continuous active areas of the pass gates with a common source/drain diffusion of the pass gates physically contiguous with each other with no shallow trench isolation or fuel bauxites in between. The use of the contiguous source/drain diffusion areas for the pass gates minimizes the shallow trench isolation stress impact along with reduced variability in the conductivity with the regions with an estimated performance gain of approximately 5%.

Another benefit is that a wider word-length can be supported. According to the present design, 72 bits without a repeater and, in addition, 144 bits with repeaters can be allowed in a 20 nm design rule according to the current design. In addition, a two times greater density of data bits can be supported with the inventive bit cell arrangement using the existing architecture. Another substantial benefit is that the current design saves internal routing in the core of the memory cell array. Many processes forbid bi-directional polysilicon in routing and the current process provides an improvement in having direct metal contact to the source/drain regions in metal 1. In addition, the gate electrodes extend in straight, parallel lines without bends or turns, providing easy shrinkage of the design without reconfiguration. This improves the routing and provides for fully aligned single port bit cells, if desired. A yet further advantages is that the sizes of the pass gates and the pull down gates can be individually designed to improve the performance of each. Namely, the pass gates have a physically isolated source/drain diffusion separate from the pull down transistors. This permits the pass gates to be optimized to perform their function as pass gates, which in many instances does not require as wide of a gate electrode nor the same current capability of the pull down transistors. Similarly, the pull down transistors can be individually designed to best perform their functions as pull down transistors and not have to perform the dual function of the same source/drain region also being physically in common with the pass gates. The two diffusions, for the pass gate and storage nodes, are electrically coupled by a very low resistivity metal strip and thus, good electrical conduction is provided between them while permitting them to be physically isolated from each other as separate active areas and diffusions in the silicon substrate. Accordingly, the performance can be customized for each of the transistors to perform each of the functions that they are designed for best without having to be worried about the tradeoff of the performance of the pull down transistor effecting the performance of the pass gate transistor and vice a versa.

Additional benefits are also obtained by the aspect ratio of the memory cell. In a preferred embodiment, the aspect ratio is in the range of 3. In one embodiment, as illustrated herein, the aspect ratio may be in the range of 2.5-2.9, as can be seen in FIGS. 7-12. If it is desired to widen the bitline and the source/drain lines, in some embodiments the aspect ratio may be in the range of 3-3.3 and in one embodiment, is approximately 3.2. Accordingly, the present memory cells has an aspect ratio of approximately 3 in one embodiment. If a smaller aspect ratio is critically important, it is possible, using the current memory cell design, to have the bitlines overlap the power lines Vss and Vdd, bringing the bitlines closer to the center of the memory cell and reduce the aspect ratio to in the range of 1.5, similar to that as shown in FIG. 11A.

It will be apparent to those of skill in the art, viewing FIGS. 9-13, how to achieve this by sliding the bitlines 174, 176, 178, 180 closer toward the center of the cell and closer to each other as the design rules permit and directly overlap power lines 158, 160. Thus, a memory cell having an aspect ratio of approximately 1.5 is easily achievable according to the present design. In some instances, a lower aspect ratio is preferred as a trade off compared to the RC time constants which may be created by having too metal lines overlap each other. In other instances, a slightly larger memory cell is acceptable, having a larger aspect ratio in exchange for improved performance, increased access time and access capability. Accordingly, the current memory cell layout provides the availability to have high speed and large current with a compact design while giving the flexibility to increase the density of the layout or increase the access speed according to the desires of the preferred design.

In some embodiments, in which the SRAM cell is used as the register of a microprocessor, such as used in iPhones, set top boxes, and other places where high speed SRAMs are of high importance for rapid operation, having a slightly larger memory cell with increased access speed is a good trade off and, thus, the current memory cell as shown in FIGS. 7-11, 12 and 13 having an aspect ratio of approximately 3 is a preferred design in many embodiments. In other designs, the memory cell of FIG. 11A is preferred.

FIGS. 14 and 15 illustrate an alternative embodiment of the inventive memory cell in which the gate electrode is comprised of polysilicon. Further, in the particular alternative embodiment shown, metal 1 is electrically coupled to the substrate by a contact opening through a dielectric layer instead of being in direct electrical and physical connection for its entire length as shown for the embodiment of FIGS. 8-12. Accordingly, the embodiment shown in FIG. 14 has two design differences: the gate electrode is polysilicon and a premetal dielectric is positioned above poly 1 so that any metal interconnections to the lower layers must be made through the appropriate via openings, contact openings, or the like, such as a tungsten plug.

It is of course possible to only make one of the changes in various alternative embodiments. For example, in the design of FIG. 8, the metal connections to metal 1 can be made through tungsten plugs or contact openings through a premetal dielectric or, alternatively, the other change of having the gate electrode made of a polysilicon instead of a metal. Thus only some of the differences between FIG. 14 and FIG. 8 can be present in the various embodiments, but not all of them.

FIG. 14 is a physical layout of the same memory cell as shown in FIG. 6, and is the same electrical connection. Common reference numbers are used for the electrical connections in FIG. 6 as well as for the physical location of various items of FIGS. 7 and 8.

FIG. 14 shows the alternative embodiment memory cell at the same stage of manufacture as FIG. 8 of the first embodiment. Those portions of the memory cell which are common to FIG. 8 and FIG. 14 are labeled with the same reference number. Specifically, the embodiment shown in FIG. 14 includes source regions 121 and 127 of the pull down transistors and storage nodes 123 and 125 of the N-channel transistors which will be electrically coupled to the storage nodes of the P-channel transistors 135 and 139, respectively. Similarly, the alternative embodiment of FIG. 14 includes a common gate electrode 124 for both the pull down transistor PD-1 and the gate electrode 132 of the pull up transistor PU-1. The common gate electrode for the other storage node, node 2, includes common gate electrode 126 for the pull down transistor PD-2 and the gate electrode 134 of the pull up transistor PU-2. Metal 1 is deposited, pattern etched so as to form metal interconnect segments to electrically connect portions of the memory cell. A single large metal strip of metal 1 electrically connects all of the node 1 together. Specifically, node 1 electrically connects the diffusions 123 and 135 to each other with an electrical connection 146 which is electrically coupled to node 142, which also electrically connects to the pass gate contact points 102 and 108, as shown in FIG. 14 and as can also be seen in FIG. 6. Similarly, node 2 electrically connects the diffusions 125 and 139 to each other as well as electrical contacts 144, 116, 122, and 140, again referring jointly to FIGS. 14 and 6 for common reference numbers for common electrical circuit locations. FIG. 14 also contains the corresponding electrical connection portions in FIG. 8, namely, connections 150, 152, 154, and 156 which will be made for the wordline contacts to be applied in later metal steps. Similarly, horizontally extending strips 104, 105, 114, and 120 are formed in metal 1 in preparation for the bitlines to contact them in later steps.

In the embodiment shown in FIG. 14, the contact to node 1 of metal 1 is made to the common source drain diffusion of the pass gate transistors through two separate contacts which are electrically in common but are physically separated. For example, viewing node 1 in FIG. 14 it can be seen that contacts 102 and 108 are physically separated from each and extend as two separate arms of the common metal strip that makes up the contact 146 of node 1. In one embodiment, having the electrical contacts 102 and 108 physically separated from each other and coupled electrically in common at a node 142 is preferred for various reasons while, in other embodiments, having a single large metal strip that is electrically and physically in common for the contacts 102 and 108 is preferred, of the type shown in FIG. 8. Accordingly, either type of electrical contact can be used, depending on the design characteristics of the materials being used.

The FIG. 14 cell composed of polysilicon gates also has a number of advantages over the prior art memory cells, even those in which the gate electrodes are of polysilicon. For example, the aspect ratio is approximately 3, as can be seen by measuring the memory cell shown in FIG. 14. In some embodiments, the width of the bitlines and Vss will be reduced to have a smaller aspect ratio, for example in the range of 2-2.8, although an aspect ratio of 3 is substantially beneficial over the prior art memory cells having aspect ratios of 5 or greater.

Another benefit of the memory cell embodiment of FIG. 14 is the use of polysilicon for the gate electrodes. Common process technologies in use today rely on polysilicon for forming the gate electrode. In many different microprocessor designs, the gate electrodes are composed of polysilicon, not metal. Therefore, since it desired to form an SRAM that compatible with process technology of the chip on which it is used as an embedded SRAM, a design using poly gates and an M1 with contacts and vias to other levels is sometimes preferred. Accordingly, there is a great deal of situations for forming gate electrodes of polysilicon, and in some embodiments, particularly slightly larger designs such as 32 nm or 40 nm, a polysilicon gate electrode has higher yields and is preferred. Accordingly, in those embodiments the gate electrode is comprised of polysilicon and the first level of interconnect is formed of metal 1, which makes electrical connection to the substrate and to the polysilicon below it through an pre-metal dielectric. The embodiment therefore has the benefit of being able to be easily manufactured by a large number of front end furnaces which are in operation today. Current technologies can be easily adapted in order to make the memory cell of FIG. 14. There are a number of other overlaps between the memory cell of FIG. 14 and FIGS. 7, 8 and 9 which can be seen by observing the figures and comparing them to each other, and the details need not be repeated here. The same reference numbers are used in all the figures for ease in seeing the corresponding structures in each design.

FIG. 15 shows all conductive layers of the alternative embodiment of the inventive memory cell from FIG. 14. Also, as in FIG. 14, the N-well for the P-channel transistors is not shown, for ease of reference, but as will be appreciated, the P-channel transistors are in isolated N-wells similar to that shown for FIG. 7 of ANOTHER embodiment. FIG. 15 shows a source line 158 and a Vdd power line 160. Similar to that shown with respect to the prior embodiment of FIGS. 10-12, the source line 158 is the widest line on the chip and has the lowest resistance. It is substantially wider than the bitlines, and in one embodiment is approximately double the width of the bitlines. In the embodiment shown in FIG. 15, only a single electrical contact is shown between Vss and the source regions, although, as will be appreciated, two or more parallel contacts can be provided from a single source region to the Vss line. It is also to be noted that the electrical connections to the source line occur in the memory cell only at locations 128 and 130. The electrical interconnect to nodes 144 and 146 are between metal 1 and the diffusion in the substrate, and do not extend between metal 1 and metal 2. It is appreciated that in a black and white drawing of the type that must be submitted in the Patent Office, the showing of the specific contact locations between the various metal levels is somewhat difficult to illustrate. Accordingly, it is to be appreciated that the metal line Vss of course only contacts the source regions of the N-channel transistors, and not the storage nodes. Similarly, the positive power supply line 160 couples only to the source regions 136 and 138 of the P-channel transistors and does not electrically contact to storage node 1 and node 2 respectively, which are directly below it. FIG. 15 also shows lines 174 and 176 coupled to the true node in complementary bitlines $\overline{A}$ and $\overline{B}$ 178 and 180 respectively, coupled to the complement node, node 2. The bitlines are coupled by the same electrical connections explained with respect to FIGS. 10-12, and therefore are not repeated here. Wordlines 170 and 172 provide access to Port A and Port B, respectively. For ease of illustration in FIG. 15, the wordlines 170 and 172 are shown at each end of the image and are broken away so that they are not shown in the central region of the memory region where they extend. As will be appreciated, if the wordlines are shown for their entire length across the memory cell in FIG. 15, a substantial portion of the memory cell will be obscured below the wordlines, and therefore, for ease of understanding the memory cell layout, only the contact locations of the wordlines are shown at each end of the cell and it will be appreciated by those of skill in the art that the wordlines extend in horizontal parallel across the memory cell to provide access to Port A and Port B.

The portions shown in FIG. 15 correspond to the same portions of FIG. 12, only some of which are labeled in FIG. 15. For example, the pull down transistors have source regions 121 and 127 which are electrically coupled in common although they are physically separated. The pull down transistors also have their respective drain diffusions 123 for pull down transistor PD-1 and 125 for pull down transistor PD-2, that form respectively node 1 and node 2 of the storage node. A common source/drain diffusion of the pass gate transistors 109, 117 is formed for both the A bit line and the B bit line, and the Port A wordline as well as the Port B wordline can both provide equal, and simultaneous access to common diffusion 109 for the node 1 data, while common diffusion 117 provides access to the complementary node data. As can be seen in FIG. 14, electrical contacts 140 and 142 provide electrical connection between the gates and the storage node, with node 140 providing electrical connection between data node 2 and the gates of PU-1 and PD-1, and node 142 providing electrical connection between the storage node 1 and the transistors PU-2 and PD-2. Even though in FIG. 15 the contacts 140 and 142 are shown as being overlapped by the bitlines, the contact extends only between polysilicon and metal 1 and does not extend from metal 1 to metal 2, which makes up the bitline. In addition, the polysilicon that makes up the gate electrodes has a slightly different shape in FIG. 15 in the central region of the cell than in FIG. 14 as one alternative embodiment. As can be seen, from each of the contact locations 140 and 142 the poly extends towards the center of the cell. This embodiment provides more uniform layout and the poly lines act as dummy structures in this region to provide better stacking and imaging of the various layers. In addition, it increases the overall area of the each of the storage nodes. Similar additional dummy layers and structures can be left within the various embodiments of FIGS. 7-13 to improve the stacking of the various layers when making the semiconductor.

In FIG. 15, similar to that shown with respect to FIGS. 10 and 11, the A bitlines are electrically connected by vias 104*a* and 114*a* to metal 1, and metal 1 makes electrical connection via contacts 104 and 114 to the diffusion which makes up the source/drain region of the pass gate transistors. Even though the B bitline is shown as passing over contacts 104 and 114, there is no electrical connection between the B bitline at these two locations because the contact occurs at a lower level, and therefore the A bitline is eclectically isolated from the B bitline.

In the memory cell shown in FIG. 15, three metal layers are shown, M1, M2 and M3. Accordingly, a first metal layer M1 provides electrical connection between the various internal nodes of the memory cell so that all of node 1 is electrically coupled together and all of node 2 is electrically coupled together. M2 provides the electrical connections for the bitlines and Vss, with all the bitlines being in the same metal lever with Vss and Vdd. A third metal level, M3 as shown in 170 and 172, provides the wordline electrical connection. In some embodiments, the bitlines and Vss are formed in metal 2 and the wordlines in metal 3, while in an alternative embodiment, the wordlines are formed in metal 2 and the bitlines are formed in metal 3.

The memory cell as shown in FIGS. 14 and 15 has the advantages as described herein as being compact, having an aspect ratio of 3 or less, and advantageously, providing rapid access speed and high current flow for a dual port SRAM.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure for an SRAM memory cell comprising
a substrate;
a first active area that is physically isolated from all other active areas in the memory cell, the first active area being part of a first data storage node and a drain region of a first transistor;
a second active area that is physically isolated from all other active areas in the memory cell, the second active area being part of a second data storage node and a drain region of a second transistor;
a third active area that is physically isolated from all other active areas in the memory cell, the third active area forming part of the first data storage node and a drain region of a third transistor;
a fourth active area that is physically isolated from all other active areas in the memory cell, the fourth active area being part of the second data storage node and drain region of a fourth transistor;
a fifth active area that is part of the first data storage node and is common physical area shared by a fifth and sixth transistor;
a sixth active area that is part of the second data storage node and is common physical area shared by a seventh and eighth transistor, the first active area at least partially disposed between the third active area and the sixth active area;
a first metal layer that electrically connects the first, third and fifth active areas to form the first data storage node; and
a second metal layer that electrically connects the second, fourth and sixth active areas to form the second data storage node.

2. The SRAM cell of claim 1 further including:
a physical and electrical interconnection from the first metal layer to a gate electrode of the second transistor; and
a physical and electrical interconnection from the second metal layer to a gate electrode of the first transistor.

3. The SRAM cell of claim 2 wherein the first metal layer physically connects to the first, third and fifth active areas.

4. The SRAM cell of claim 1 further including:
a metal row line that is electrically coupled to a gate electrode of the fifth and seventh transistors, respectively; and
a metal row line that is electrically coupled to a gate electrode of the sixth and eighth transistors, respectively.

5. The SRAM cell of claim 1 further including a metal source connection that is electrically coupled to an active area of the first and second transistors, respectively.

6. The SRAM cell of claim 1 wherein the first metal layer is in physical contact with the entire region of the first active area that it overlies.

7. An SRAM memory cell comprising:
a substrate;
a first active area that is physically isolated from all other active areas in the memory cell, the first active area being part of a first data storage node and a drain region of a first transistor;
a second active area that is physically isolated from all other active areas in the memory cell, the second active area being part of a second data storage node and a drain region of a second transistor;
a third active area that is physically isolated from all other active areas in the memory cell, the third active area forming part of the first data storage node and a drain region of a third transistor;
a fourth active area that is physically isolated from all other active areas in the memory cell, the fourth active area being part of the second data storage node and drain region of a fourth transistor;
a fifth active area that is part of the first data storage node and is part of a fifth transistor; and
a sixth active area that is part of the second data storage node and is part of a sixth transistor, the first active area at least partially disposed between the third active area and the sixth active area.

8. The SRAM cell of claim 7 wherein the third active area is at least partially disposed between the first active area and the fifth active area.

9. The SRAM cell of claim 1 wherein the third active area is at least partially disposed between the first active area and the fifth active area.

* * * * *